(12) United States Patent
Taniguchi

(10) Patent No.: US 8,705,271 B2
(45) Date of Patent: Apr. 22, 2014

(54) SEMICONDUCTOR DEVICE

(71) Applicant: Renesas Electronics Corporation, Kawasaki (JP)

(72) Inventor: Yasuhiro Taniguchi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/726,588

(22) Filed: Dec. 25, 2012

(65) Prior Publication Data
US 2013/0113030 A1 May 9, 2013

Related U.S. Application Data

(63) Continuation of application No. 12/818,248, filed on Jun. 18, 2010, now Pat. No. 8,351,254.

(30) Foreign Application Priority Data

Jun. 25, 2009 (JP) ................. 2009-151296

(51) Int. Cl.
*G11C 11/34* (2006.01)
(52) U.S. Cl.
USPC ............ 365/185.01; 365/185.18; 365/185.05; 365/185.1; 365/185.29; 365/185.26
(58) Field of Classification Search
USPC ............... 365/185.18, 185.01, 185.05, 185.1, 365/185.29, 185.26; 257/E29.3, 315
See application file for complete search history.

(56) References Cited

U.S. PATENT DOCUMENTS

| 7,326,994 | B2 * | 2/2008 | Hsu et al. ............... 257/315 |
| 7,919,368 | B2 | 4/2011 | Wu et al. |
| 2008/0251832 | A1 * | 10/2008 | Chih et al. ............... 257/315 |
| 2009/0290417 | A1 * | 11/2009 | Park et al. ............ 365/185.08 |
| 2011/0116324 | A1 | 5/2011 | Haggag et al. |
| 2011/0176368 | A1 | 7/2011 | Kalnitsky et al. |

FOREIGN PATENT DOCUMENTS

JP    2004-253685 A    9/2004

\* cited by examiner

*Primary Examiner* — Fernando Hidalgo
(74) *Attorney, Agent, or Firm* — Miles & Stockbridge P.C.

(57) ABSTRACT

The performance of a semiconductor device including a nonvolatile memory is enhanced. Each of nonvolatile memory cells arranged over a silicon substrate includes: a first n-well; a second n-well formed in a place different from the place thereof; a selection transistor formed in the first n-well; and an electric charge storage portion having a floating gate electrode and a storage portion p-well. The floating gate electrode is so placed that it overlaps with part of the first n-well and the second n-well. The storage portion p-well is placed in the first n-well so that it partly overlaps with the floating gate electrode. In this nonvolatile memory cell, memory information is erased by applying positive voltage to the second n-well to discharge electrons in the floating gate electrode to the second n-well.

15 Claims, 21 Drawing Sheets

$Vfg = C1/Ct \times V1 + C2/Ct \times V2 - Q/Ct$

SEMICONDUCTOR DEVICE

CROSS-REFERENCE TO RELATED APPLICATIONS

The disclosure of Japanese Patent Application No. 2009-151296 filed on Jun. 25, 2009 including the specification, drawings and abstract is incorporated herein by reference in its entirety.

BACKGROUND OF THE INVENTION

The present invention relates to semiconductor device technologies and in particular to a technology effectively applicable to a semiconductor device having a nonvolatile memory cell.

One of storage devices (memories) provided in semiconductor devices is nonvolatile memory. This is a memory that holds memory information even after power supply is turned off and nonvolatile memories include ROM (Read Only Memory), Flash memory, phase-change memory, and the like.

Among the above-mentioned nonvolatile memories, there is an element that stores electric charges, such as electrons, in a conductor film in floating state and thereby stores information. As an example, it will be assumed that a field effect transistor (also referred to as FET) with an MIS (Metal Insulator Semiconductor) structure (hereafter, simply referred to as MIS transistor) having a conductor film in floating state as a gate electrode is configured. In this case, the state of electric charges of this floating gate electrode manifests itself as change in threshold voltage. Thus the state of memory can be read from the drain current of an MIS transistor or the like. Electric charges accumulated in a floating gate electrode are less prone to leak to outside and thus information can be held without the supply of power.

Among nonvolatile memories having such a floating gate electrode, there is a nonvolatile memory whose floating gate electrode is formed by the same process as for the gate electrode of another MIS transistor. This facilitates manufacturing processes and the fabrication yield and the reliability of semiconductor devices having a nonvolatile memory are enhanced. The structure of this floating gate electrode of a nonvolatile memory is comprised of a single-layer conductor film similarly with ordinary MIS transistors. Control of an electric field for injecting electric charges into a floating gate electrode is carried out by, for example, the coupling capacitance between a well formed in a substrate and the floating gate electrode or the like.

For example, Japanese Unexamined Patent Publication No. 2004-253685 (Patent Document 1) discloses EEPROM (Electrically Erasable Programmable ROM) including a single-layer polysilicon floating gate of P conductivity type.

[Patent Document 1] Japanese Unexamined Patent Publication No. 2004-253685

SUMMARY OF THE INVENTION

In the nonvolatile memory examined by the present inventors, one floating gate electrode portion that accumulates electric charges and one MIS transistor (selection transistor) portion for access control are formed in an identical active region and comprise one memory cell. As mentioned above, the floating gate electrode and the gate electrode of the MIS transistor are formed by the same process. A control gate electrode or the like is not placed over the floating gate electrode and it is comprised of a single-layer conductor film (polycrystalline silicon). The electric field of the floating gate electrode is controlled using the coupling capacitance between it and a well formed in the substrate. The present inventors examined a semiconductor device having such a single-layer floating gate electrode-type nonvolatile memory and found that it involves the problems described below.

For example, a state in which electrons are injected into a floating gate electrode and the threshold voltage of a p-channel MIS transistor is lowered will be taken as write state. Meanwhile, a state in which electrons are extracted from a floating gate electrode and the threshold voltage is increased is erase state. At this time, it is required to bring the floating gate electrode into reverse potential state to write state. However, when the electric field of a floating gate electrode is controlled by the coupling capacitance between it and a well as mentioned above, it is difficult to invert the polarity of an electric field and electrons cannot be effectively extracted. Therefore, electrical erasing is impossible in the nonvolatile memory examined by the present inventors. This memory may be designated as OTP (One Time Programmable) memory.

During the operation of writing to a floating gate electrode, the floating gate electrode is gradually filled with electrons. In this state, a negative own electric field is produced in the floating gate electrode and the injection of electrons into the floating gate becomes less prone to occur with time.

As mentioned above, it was found that in the nonvolatile memory examined by the present inventors, erase operation was impossible and it was also impossible to sufficiently write data and thus further enhancement of its performance was difficult.

Consequently, it is an object of the invention to provide a technology for enhancing the performance of a semiconductor device having a nonvolatile memory.

The above and other objects and novel features of the invention will be apparent from the description in this specification and the accompanying drawings.

The present application discloses multiple embodiments of the invention and the following is a brief description of the gist of one of these embodiments:

The embodiment is a semiconductor device having nonvolatile memory cells arranged over a semiconductor substrate. Each nonvolatile memory cell includes: an n-type first semiconductor region formed in the main surface of the semiconductor substrate; an n-type second semiconductor region formed in the main surface of the semiconductor substrate and in a place different from the place of the first semiconductor region; a selection transistor formed in the first semiconductor region; and an electric charge storage portion having a floating gate electrode and a p-type third semiconductor region. The floating gate electrode is placed over the semiconductor substrate so that it overlaps with part of the first semiconductor region and the second semiconductor region when the main surface of the semiconductor substrate is viewed in a plane. The third semiconductor region is formed beside and under the floating gate electrode in the first semiconductor region and is so arranged that it partly overlaps with an end of the floating gate electrode when the main surface of the semiconductor substrate is viewed in a plane. Each nonvolatile memory cell is an element that accumulates electric charges in a floating gate electrode and thereby stores information. Memory information is erased by applying positive voltage to the second semiconductor region to discharge the electrons accumulated in the floating gate electrode to the second semiconductor region.

The following is a brief description of the gist of a representative effect obtained by the above embodiment of the invention laid open in this application:

It is possible to enhance the performance of a semiconductor device having a nonvolatile memory.

DETAILED DESCRIPTION OF THE PREFERRED EMBODIMENTS

Figure 1:
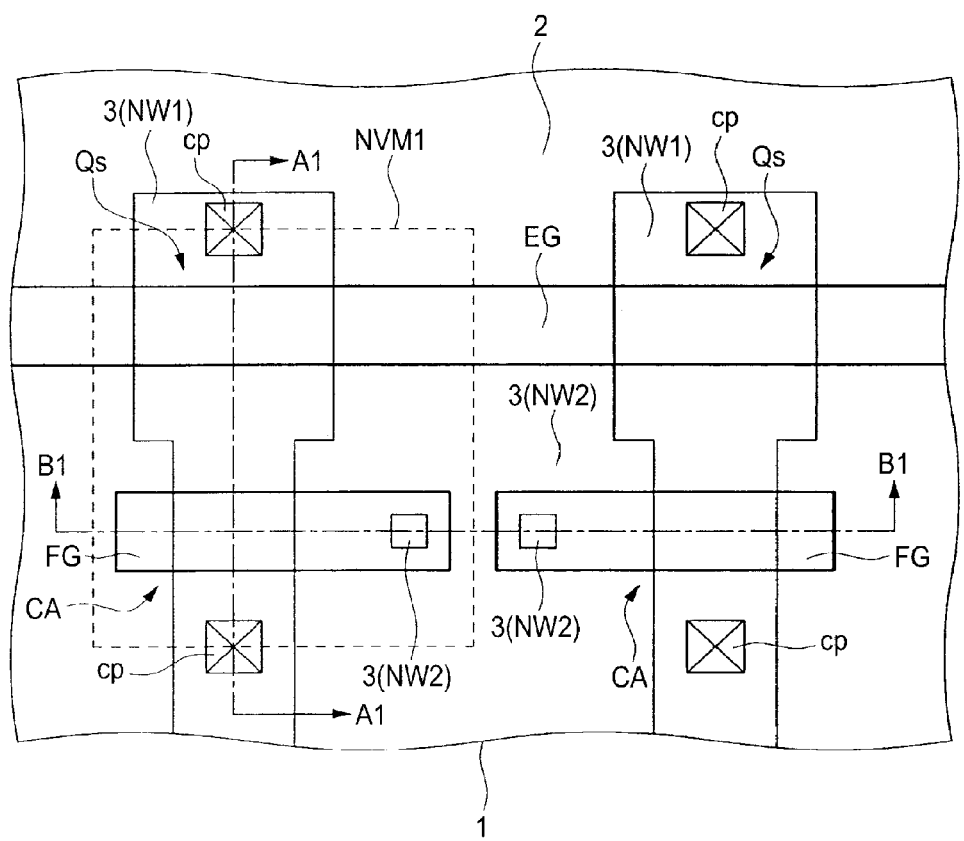
FIG. 1 is a substantial part plan view of a semiconductor device in a first embodiment of the invention.

In the following description, each embodiment will be divided into multiple sections if necessary for the sake of convenience. Unless explicitly stated otherwise, they are not unrelated to one another and they are in such a relation that one is a modification, details, supplementary explanation, or the like of part or all of the other. When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies and the number may be above or below that specific number. In the following description of embodiments, needless to add, their constituent elements (including elemental steps and the like) are not always indispensable unless explicitly stated otherwise or they are obviously indispensable in principle. Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges. In all the drawings for explaining embodiments, members having the same function will be marked with the same reference numerals and the repetitive description thereof will be omitted wherever possible.

When some region is represented to be "of high concentration" in the description of embodiments, the entire region in the direction of the depth of the semiconductor substrate need not be of high concentration. It indicates that the region is high in concentration peak value. Or, it indicates that the region is high in average concentration in the direction of the depth of the semiconductor substrate. When some region is represented to be "of low concentration," the foregoing applies.

The nonvolatile memory of the invention is used as a storage device (memory) provided in, for example, a semiconductor device equipped with a processor, CPU (Central Processing Unit), or a microcomputer.

Hereafter, detailed description will be given to embodiments of the invention with reference to the drawings.

(First Embodiment)

Figure 2:
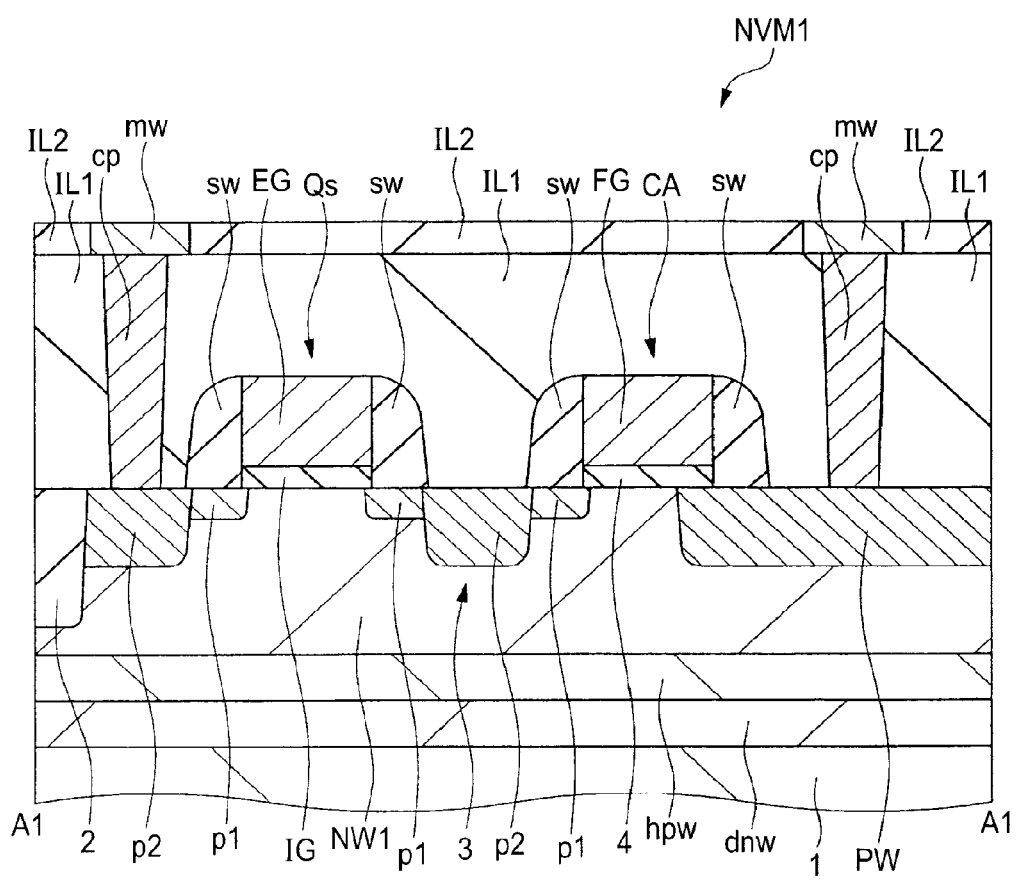
FIG. 2 is a substantial part sectional view of the semiconductor device in the first embodiment taken along line A1-A1 in the substantial part plan view in FIG. 1 and viewed in the direction of the arrows.
Figure 3:
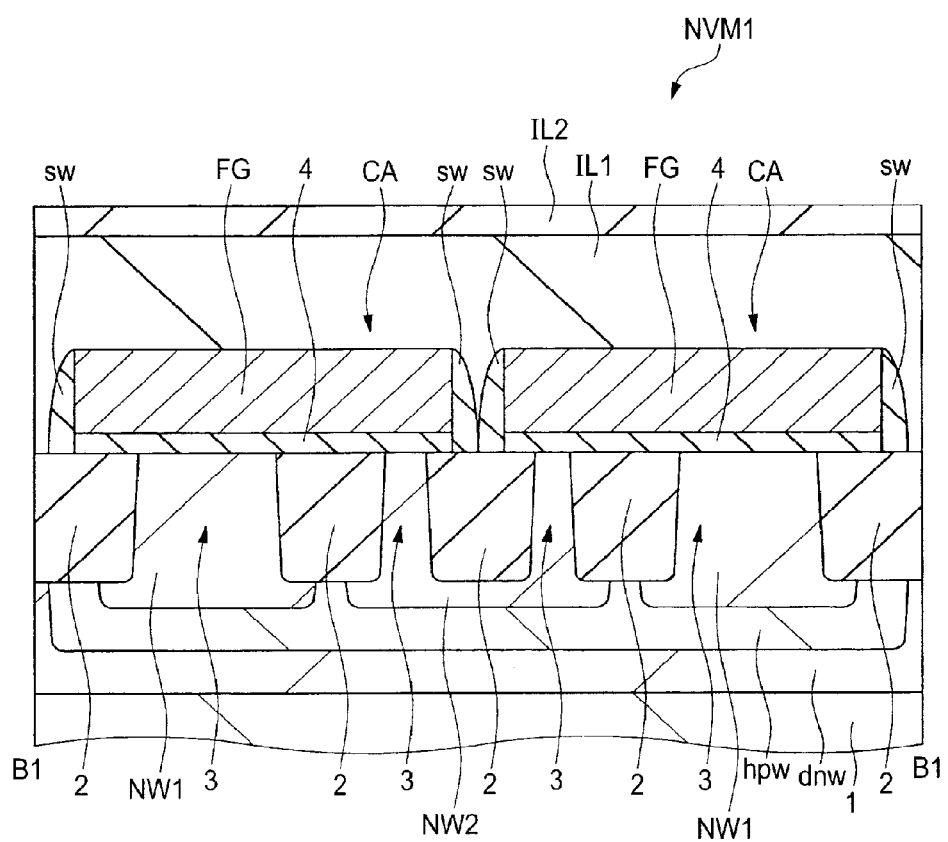
FIG. 3 is a substantial part sectional view of the semiconductor device in the first embodiment taken along line B1-B1 in the substantial part plan view in FIG. 1 and viewed in the direction of the arrows.

FIG. 1 is a substantial part plan view of a peripheral area of a nonvolatile memory provided in a semiconductor device in the first embodiment. The area encircled with a broken line in FIG. 1 is equivalent to one memory cell that stores unit information. Hereafter, this area will be described as nonvolatile memory cell NVM1. FIG. 2 is a substantial part sectional view of the area taken along line A1-A1 of FIG. 1 and viewed in the direction of the arrows. FIG. 3 is a substantial part sectional view of the area taken along line B1-B1 of FIG. 1 and viewed in the direction of the arrows. Hereafter, detailed description will be given to the structure of a nonvolatile memory cell NVM1 provided in the semiconductor device in the first embodiment with reference to FIG. 1 to FIG. 3. The nonvolatile memory cell NVM1 in the first embodiment includes the following constituent elements:

The nonvolatile memory cell NVM1 is formed in a silicon substrate (semiconductor substrate) 1 comprised of single-crystal silicon (Si). In the main surface of the silicon substrate 1, there are formed isolation portions 2 with a shallow trench isolation (STI) structure and these isolation portions define active regions 3. An element or a feeding portion is formed in the active regions 3 defined by the isolation portions 2 as mentioned above.

On the main surface side of the silicon substrate 1, there is formed an n-well dnw for isolation (well for isolation) as a semiconductor region of n conductivity type. The n conductivity type cited here represents such a conductivity type of semiconductor region that in a semiconductor region or the like comprised predominantly of silicon, phosphorus (P) or arsenic (As) in the V group or a VI-group element is contained and the majority carrier is electron. A p-well hpw for element (well for element) as a semiconductor region of p conductivity type is so formed that it is embraced in the n-well dnw for isolation. The p conductivity type cited here represents such a conductivity type of semiconductor region that in a semiconductor region or the like comprised predominantly of silicon, boron (B) in the III group or a II-group element and the majority carrier is positive hole (also referred to as hole). The silicon substrate 1 is of p conductivity type.

A first n-well (first semiconductor region) NW1 as a semiconductor region of n conductivity type is formed in the main surface of the silicon substrate 1 so that it is embraced in the p-wells hpw for element. A second n-well (second semiconductor region) NW2 as a semiconductor region of n conductivity type is formed in the main surface of the silicon substrate 1 so that it is embraced in the p-wells for element. The second n-well NW2 is formed in a place different from that of the first n-well NW1. The isolation portion 2 and the p-well hpw for element are arranged between the first n-well NW1 and the second n-well NW2, which are electrically isolated from each other by them. Therefore, even though the first n-well NW1 and the second n-well NW2 are of the same conductivity type, or n conductivity type, voltage can be applied to them independently of each other by the feeding mechanism described later.

In the first n-well NW1, there is formed a selection transistor Qs. The selection transistor Qs is a field effect transistor having a gate electrode EG, a gate insulating film IG, and the first n-well NW1 as the MIS structure. The gate electrode EG is comprised of a conductor film comprised predominantly of polycrystalline silicon (also referred to as polysilicon) and is formed over the gate insulating film IG comprised of an insulating film comprised predominantly of silicon oxide. The gate electrode EG and the gate insulating film IG have their side walls covered with a side wall spacer sw comprised of insulator such as a silicon oxide film. In the surface of the first n-well NW1 positioned beside and under the gate electrode EG, there is formed a p-type extension region p1 as a semiconductor region of p conductivity type. In the surface of the first n-well NW1 beside and under the side wall spacer sw, there is formed a p-type source-drain region p2 as a semiconductor region of p conductivity type. The depth of the p-type source-drain region p2 from the main surface of the silicon substrate 1 is deeper than that of the p-type extension region p1 and its p-type impurity concentration is higher than that of the p-type extension region p1.

In the silicon substrate 1, there is further formed an electric charge storage portion CA. The electric charge storage portion CA is comprised of a floating gate electrode FG comprised of a conductor film and a storage portion p-well (third semiconductor region) PW as a semiconductor region of p conductivity type. In the surface of the first n-well NW1 of the active region 3 positioned between the gate electrode EG of the selection transistor Qs and the floating gate electrode FG of the electric charge storage portion CA, there is formed the same p-type source-drain region p2 as mentioned above. In other words, one of the p-type source-drain regions p2 placed beside and under the gate electrode EG of the selection transistor Qs is so formed that it is extended to the area beside and under the floating gate electrode FG of the electric charge storage portion CA.

The floating gate electrode FG is formed over the silicon substrate 1 with a floating gate insulating film 4 in-between. This floating gate electrode FG is in floating state and is not in contact with any other conductor material.

The floating gate electrode FG is placed over the silicon substrate 1 so that it overlaps with part of the first n-well NW1 and the second n-well NW2 when the main surface of the silicon substrate 1 is viewed in a plane. Especially, when the floating gate electrode FG is so arranged that it is extended in the same direction as the direction of the extension of the gate electrode EG of the selection transistor Qs, the element layout can be easily made tight. In other words, the gate electrode EG and the floating gate electrode FG are arranged in such a direction that they are orthogonal to the direction of the extension of the active region 3 including the first n-well NW1. The active region 3 including the second n-well NW2 is placed under any area in the direction of the extension of the floating gate electrode FG.

The floating gate electrode FG forms a capacity coupling (also referred to as capacitive coupling) together with the first n-well NW1 and the second n-well NW2 through the floating gate insulating film 4. Therefore, when power is fed to the first n-well NW1 or the second n-well NW2, the floating gate electrode FG can be charged by their coupling capacitance. Since the first n-well NW1 and the second n-well NW2 are independent of each other as mentioned above, the floating gate electrode FG can be charged from two independent places.

Since the floating gate electrode FG is formed by the same process as for the gate electrode EG of the selection transistor Qs, the floating gate electrode FG is also formed of a conductor film comprised predominantly of polycrystalline silicon. Since the floating gate insulating film 4 is formed by the same process for the gate insulating film IG of the selection transistor Qs, the floating gate insulating film 4 is also formed of an insulating film comprised predominantly of silicon oxide.

The storage portion p-well PW is formed beside and under the floating gate electrode FG in the first n-well NW1. At the same time, it is so arranged that it partly overlaps with an end of the floating gate electrode FG when the main surface of the silicon substrate 1 is viewed in a plane. Such an area will be designated as overlap area. Each nonvolatile memory cell NVM1 in the first embodiment is so structured that the floating gate electrode FG and the storage portion p-well PW have a capacity coupling with the floating gate insulating film 4 in-between in this overlap area. When power is fed to the storage portion p-well PW, the floating gate electrode FG can be charged by their coupling capacitance. In the nonvolatile memory cell NVM1 in the first embodiment, as mentioned above, the storage portion p-well PW functions as a control gate electrode (control electrode). The foregoing is summarized as follows: in each nonvolatile memory cell NVM1 in the first embodiment, the floating gate electrode FG can be charged from three independent places by providing the storage portion p-well PW in addition to the above-mentioned first n-well NW1 and second n-well NW2.

The storage portion p-well PW of the electric charge storage portion CA may be identical with the p-type source-drain regions p2 of the selection transistor Qs in depth and p-type impurity concentration. With this structure, the storage portion p-well PW and the p-type source-drain regions p2 can be formed at the same ion implantation step and by heat treatment under the same conditions. This simplifies the manufacturing process and makes it possible to achieve the enhancement of yield and reliability. When the storage portion p-well PW is formed by the same process as for the p-type source-drain regions p2 of the selection transistor Qs as mentioned above, the p-type extension region p1 of the selection transistor Qs is also formed by the same process. The p-type extension region p1 of the electric charge storage portion CA becomes an overlap area and is so formed that it overlaps with an end of the floating gate electrode FG.

The structure of a diffusion layer on the opposite side to the storage portion p-well PW is the same as that of the selection transistor Qs. That is, it is comprised of the p-type extension region p1 and the p-type source-drain region p2.

The nonvolatile memory cell NVM1 in the first embodiment has the above-mentioned basic structure. The nonvolatile memory cell NVM1 in the first embodiment is especially characterized in that in addition to the first n-well NW1, the second n-well NW2 independent thereof is placed under the floating gate electrode FG responsible for the accumulation of electric charges. The semiconductor device in the first embodiment includes multiple nonvolatile memory cells NVM1 arranged in an array pattern over the silicon substrate 1.

An interlayer insulating film IL1 is formed over the silicon substrate 1 so that it covers the nonvolatile memory cells NVM1. Further, an interlayer insulating film IL2 is also formed thereover. The interlayer insulating films IL1, IL2 are comprised of an insulating film comprised predominantly of silicon oxide.

The thick interlayer insulating film IL1 positioned underneath is formed for placing contact plugs cp. The contact plugs cp are comprised of a conductor film comprised predominantly of, for example, tungsten (W) or the like. The contact plugs cp are so formed that they are electrically coupled to the p-type source-drain region p2 and gate electrode EG of the selection transistor Qs, the storage portion p-well PW of the electric charge storage portion CA, and the like.

The thin interlayer insulating film IL2 positioned above is formed for placing wirings mw. The wirings mw are comprised of a conductor film comprised predominantly of, for example, copper (Cu), aluminum (Cu), or the like. The wirings mw have such a planar pattern as to couple desired contact plugs cp together (not shown). The above-mentioned interlayer insulating films, plugs, and wirings are arranged over multiple layers and multiple nonvolatile memory cells NVM1 are thereby coupled to form a desired memory cell array.

Figure 4:
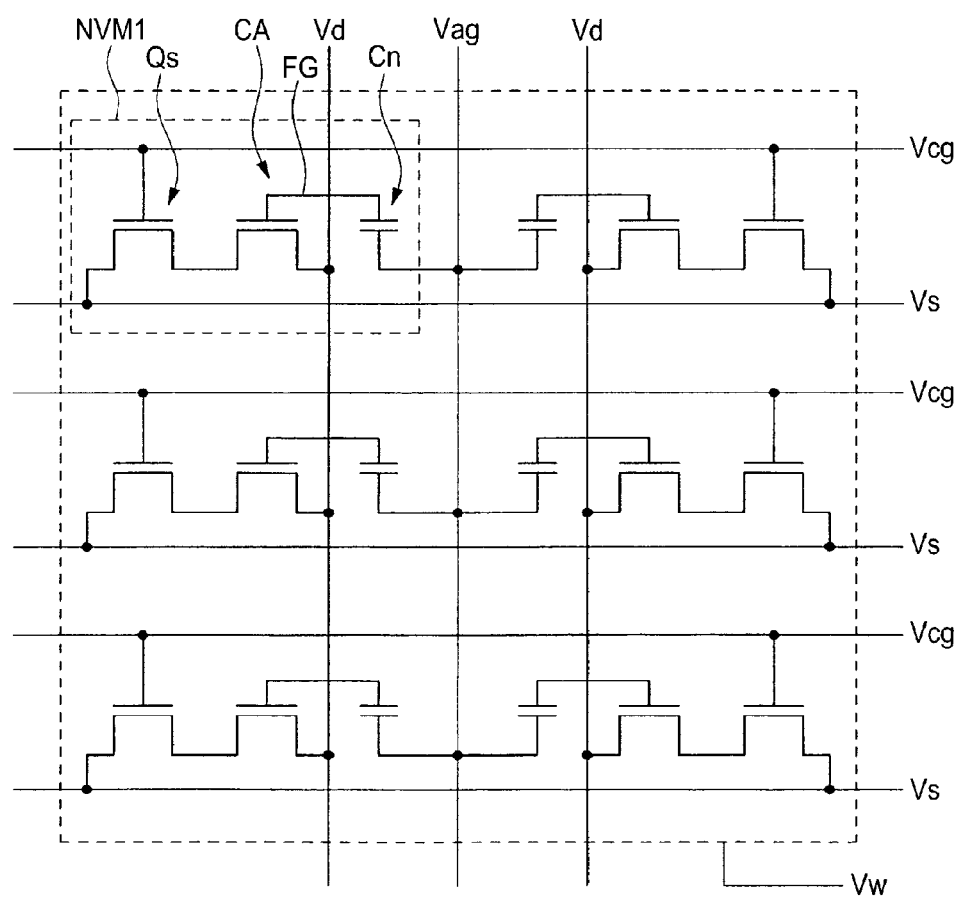
FIG. 4 is an equivalent circuit diagram of a semiconductor device in the first embodiment of the invention.

FIG. 4 is an equivalent circuit diagram of a circuit in which the above-mentioned nonvolatile memory cells NVM1 are arrayed in a matrix pattern. Each nonvolatile memory cell NVM1 is represented as an equivalent circuit having a selection transistor Qs and an electric charge storage portion CA. The electric charge storage portion CA has a floating gate electrode FG and this floating gate electrode FG has a capacity coupling Cn between it and a second n-well NW2.

Voltage applied to the gate electrode EG of the selection transistor Qs will be designated as control gate voltage Vcg. The gate electrodes EG of the selection transistors Qs arranged row-wise are fed with power in common and the same control gate voltage Vcg is applied thereto.

Voltage applied to the p-type source-drain region p2 that is not opposed to the floating gate electrode PG of the p-type source-drain regions p2 positioned beside and under the selection transistor Qs will be designated as source voltage Vs. These p-type source-drain regions p2 of the selection transistors Qs arranged row-wise are fed with power in common and the same source voltage Vs is applied thereto.

Voltage applied to the storage portion p-well PW of each electric charge storage portion CA will be designated as drain voltage Vd. The storage portion p-wells PW of the electric charge storage portions CA arranged column-wise are fed with power in common and the same drain voltage Vd is applied thereto.

Voltage applied to the second n-well NW2 of each electric charge storage portion CA will be designated as auxiliary gate voltage Vag. The second n-wells NW2 of the electric charge storage portions CA arranged column-wise and the second n-wells NW2 of the electric charge storage portions CA of the nonvolatile memory cells NVM1 adjoining row-wise are fed with power in common. The same auxiliary gate voltage Vag is applied thereto. As mentioned above, the second n-well NW2 is coupled to the floating gate electrode FG through the capacity coupling Cn and the floating gate electrode FG can be charged according to the voltage of the second n-well NW2. Therefore, when the auxiliary gate voltage Vag is applied to the second n-well NW2, voltage corresponding to the magnitude of the auxiliary gate voltage Vag is produced in the floating gate electrode FG.

Voltage applied to the first n-well NW1 will be designated as well voltage Vw. The multiple nonvolatile memory cells NVM1 in rows and columns share the first n-well NW1 among them and the same well voltage Vw is applied thereto.

Hereafter, detailed description will be given to the memory operation of each nonvolatile memory cell NVM1 in the first embodiment.

Figure 5:
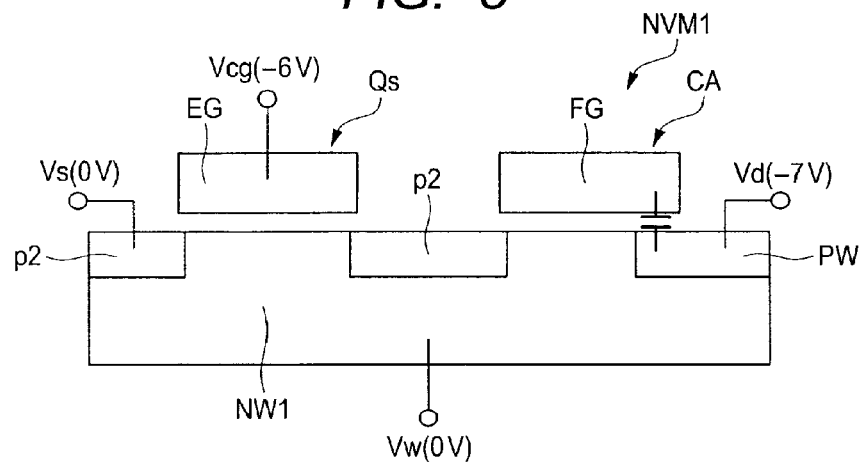
FIG. 5 is an explanatory drawing illustrating the write operation of a nonvolatile memory cell in the first embodiment of the invention.
Figure 6:
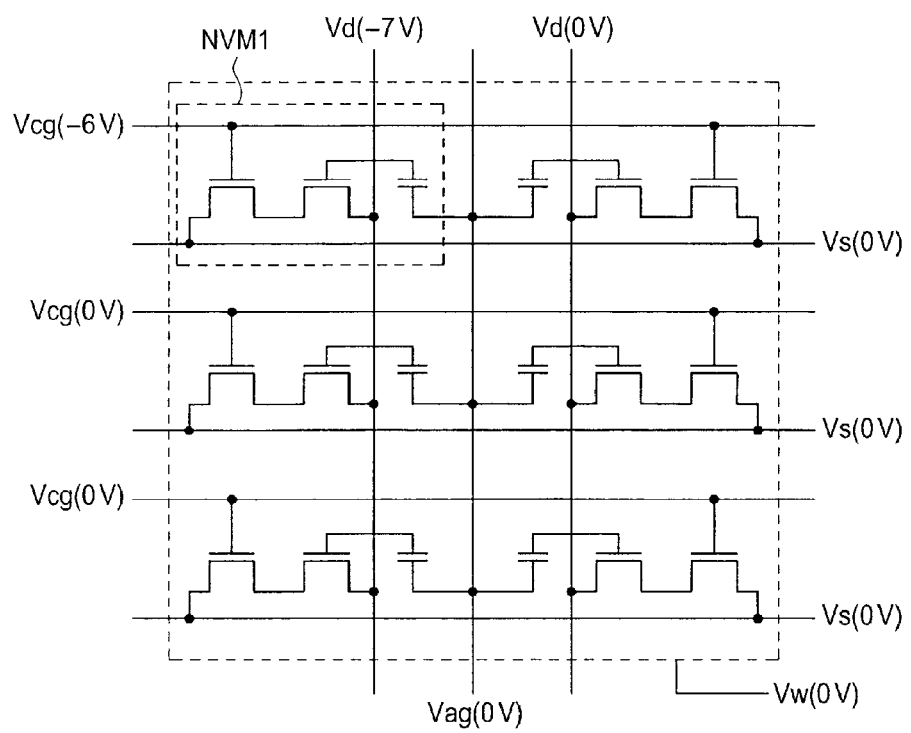
FIG. 6 is an equivalent circuit diagram illustrating the write operation of nonvolatile memory cells in the first embodiment of the invention.
Figure 7:
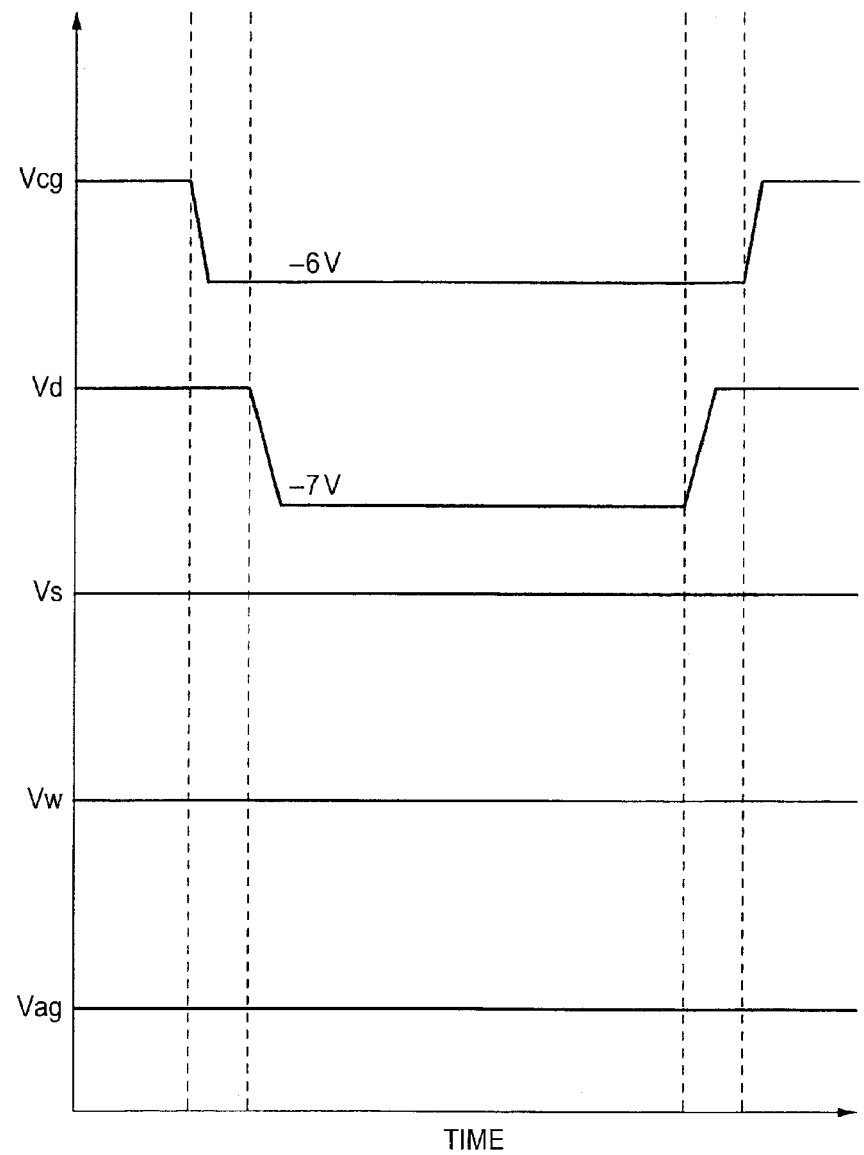
FIG. 7 is a graph chart indicating the timing of applied voltage during the write operation of nonvolatile memory cells in the first embodiment of the invention.
Figure 8:
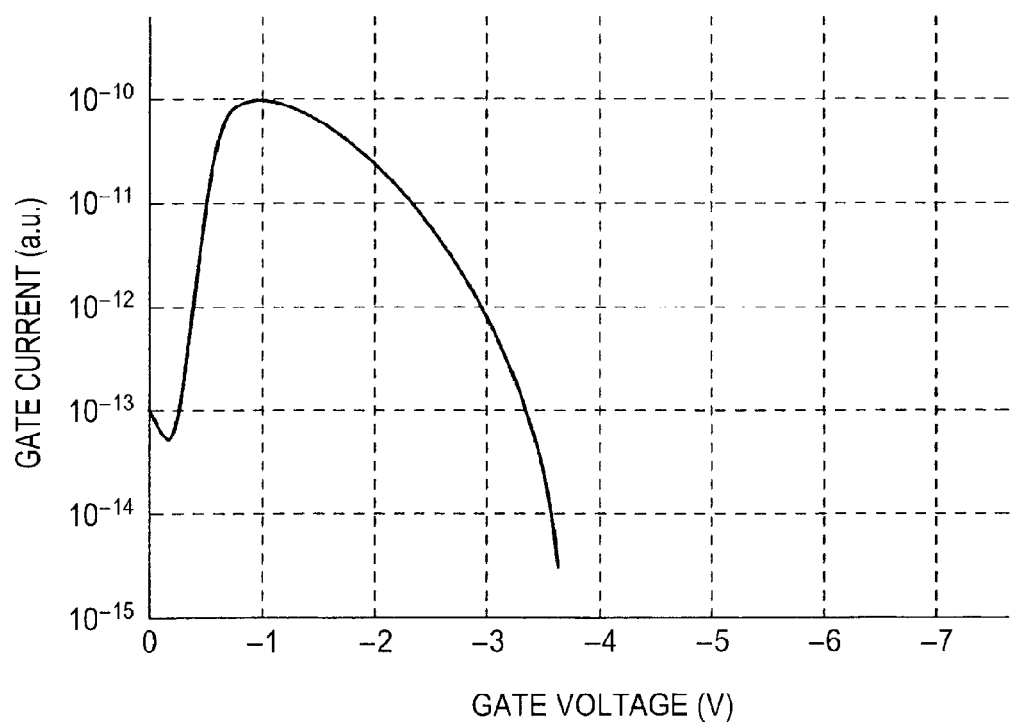
FIG. 8 is a graph chart indicating the characteristics of a nonvolatile memory cell in write operation in the first embodiment of the invention.

Description will be given to the write operation of each nonvolatile memory cell NVM1 in the first embodiment with reference to FIG. 5 to FIG. 8. FIG. 5 is an explanatory drawing schematically depicting the section in the nonvolatile memory cell NVM1 corresponding to FIG. 2. FIG. 6 is an equivalent circuit diagram of multiple nonvolatile memory cells NVM1 arranged in an array pattern. FIG. 7 is timing chart of each of the voltages Vcg to Vag. FIG. 8 is a graph chart indicating a write characteristic.

In write operation, electrons are injected into the floating gate electrode FG by drain avalanche hot electron (DAHE) injection. When a potential difference is further increased between, for example, source and drain in the pinch-off state in an MIS transistor, accelerated electrons repeat ionizing collision with lattices and a large quantity of electrons are produced like avalanche amplification. DAHE is such an electron that acquired high energy and has been turned into a hot electron. This DAHE penetrates a forbidden band of an insulating film and can be injected into a conductor film. That is, electrons can be injected into the floating gate electrode FG by producing DAHEs in the first n-well NW1 under the floating gate electrode FG. To accomplish this in the nonvolatile memory cell NVM1 in the first embodiment, for example, −6V is applied as the control gate voltage Vcg and −7V is applied as the drain voltage Vd in write operation. 0V is applied to the other nodes.

The characteristic indicated in FIG. 8 was obtained by examination by the present inventors. In FIG. 8 representing a p-type MIS transistor that produces DAHEs, the vertical axis is taken as gate current Ig and the horizontal axis is taken as gate voltage Vg. In DAHE injection, electrons are injected from a channel region of the MIS transistor to the gate electrode. For this reason, the amount of injection can be evaluated as the amount of gate current Ig. In other words, the gate current Ig is increased as more DAHEs are injected into the gate electrode (as DAHE injection becomes more active). As indicated in the drawing, the gate current Ig is increased as the gate voltage Vg is increased in the negative direction and it peaks when the gate voltage Vg is approximately −1V and is thereafter reduced. This is because it becomes more difficult to inject electrons as the own electric field of the gate electrode is raised in the negative direction.

In the nonvolatile memory NVM1 in the first embodiment, in accordance with the above result of examination, the drain voltage Vd of the storage portion p-well PW through the capacity coupling Cn is so set that the voltage of the floating gate electrode FG becomes −1V. This value is, for example, −7V. DAHEs can be most efficiently injected into the floating gate electrode FG by adopting this voltage condition. That is, the write operation can be accelerated. In the nonvolatile memory cell NVM1 in the first embodiment, as mentioned above, the storage portion p-well PW functions as a control gate electrode (control electrode).

As illustrated in FIG. 6, the control gate voltage Vcg=−6V and the drain voltage Vd=−7V are applied to conductive lines leading to a nonvolatile memory cell NVM1 as the target of write. As a result, write operation can be selectively carried out on one of multiple memory cells.

Figure 9:
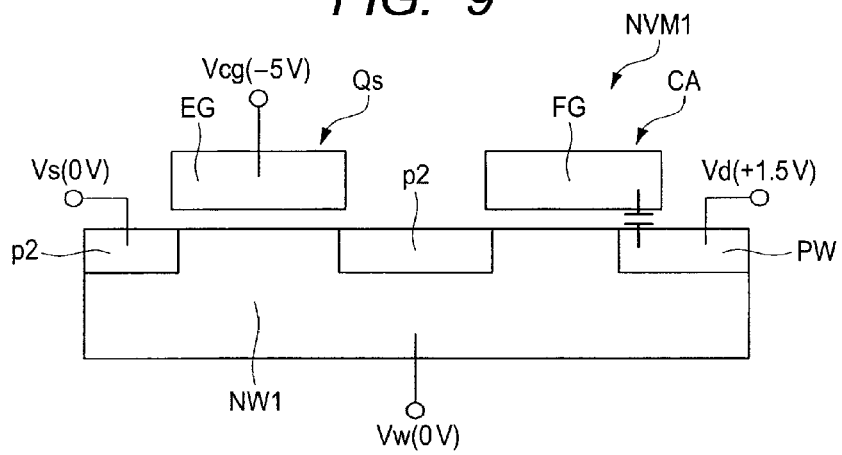
FIG. 9 is an explanatory drawing illustrating the read operation of a nonvolatile memory cell in the first embodiment of the invention.
Figure 10:
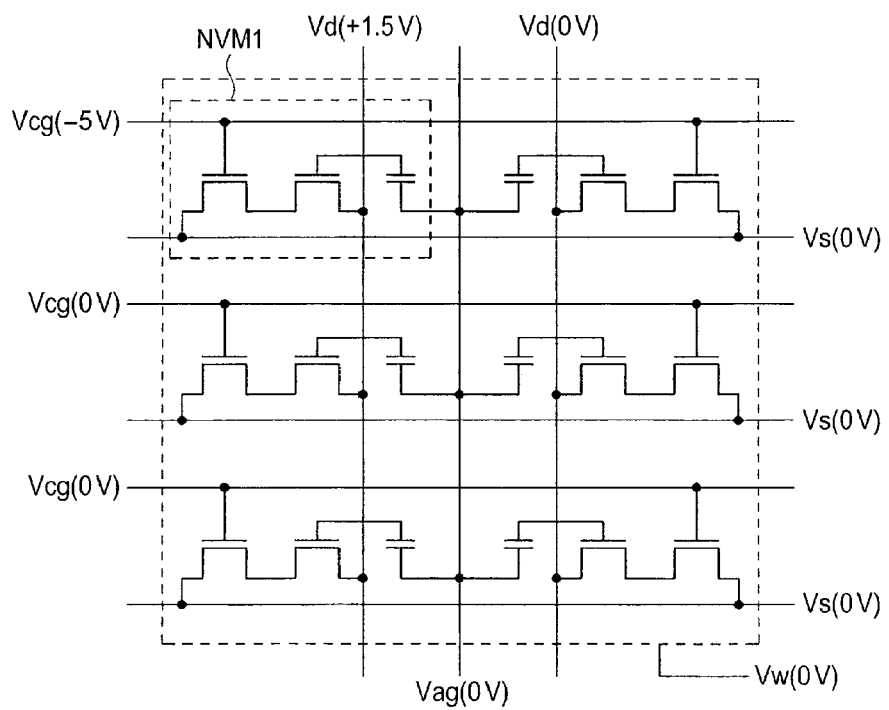
FIG. 10 is an equivalent circuit diagram illustrating the read operation of nonvolatile memory cells in the first embodiment of the invention.

Description will be given to the read operation of each nonvolatile memory cell NVM1 in the first embodiment with reference to FIG. 9 and FIG. 10. FIG. 9 is an explanatory drawing schematically depicting the section in the nonvolatile memory cell NVM1 corresponding to FIG. 2. FIG. 10 is an equivalent circuit diagram of multiple nonvolatile memory cells NVM1 arranged in an array pattern.

In read operation, for example, −5V is applied as the control gate voltage Vcg and 1.5V is applied as the drain voltage Vd. 0V is applied to the other nodes. As a result, the selection transistor Qs is turned on. Then a current flows between the p-type source-drain region p2 and the storage portion p-well PW according to the state of charging of the floating gate electrode FG of the electric charge storage portion CA.

More specific description will be given. When the nonvolatile memory cell NVM1 has undergone the write operation described above and electrons have been accumulated in the floating gate electrode FG, the following takes place: an inversion layer (channel layer) is formed in the first n-well NW1 under the floating gate electrode FG. Since a potential bias has been applied to between the p-type source-drain region p2 and the storage portion p-well PW at this time, a drain current accordingly flows. When the nonvolatile memory cell NVM1 has not undergone write operation or has undergone the erase operation described later, electrons are not accumulated in the floating gate electrode FG. Therefore, an inversion layer is hardly formed in the first n-well NW1 under the floating gate electrode FG unlike write state. Therefore, a drain current flows only slightly or does not flow at all.

Thus in the nonvolatile memory cell NVM1 in the first embodiment, the state of memory in a target cell can be determined by the magnitude of drain current (on/off of transistors).

Figure 11:
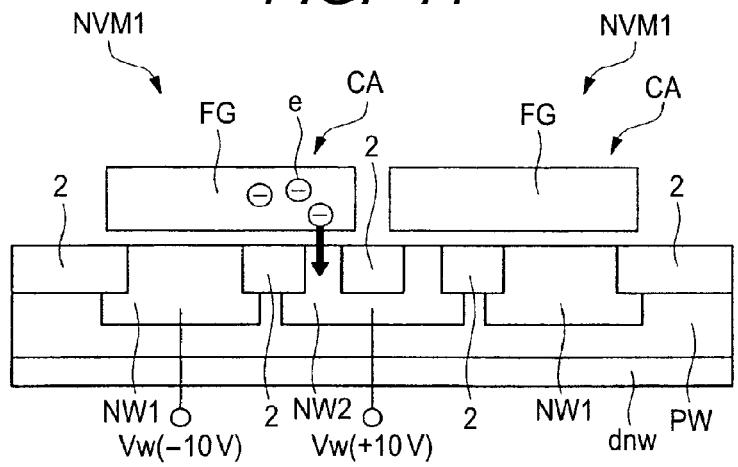
FIG. 11 is an explanatory drawing illustrating the erase operation of a nonvolatile memory cell in the first embodiment of the invention.
Figure 12:
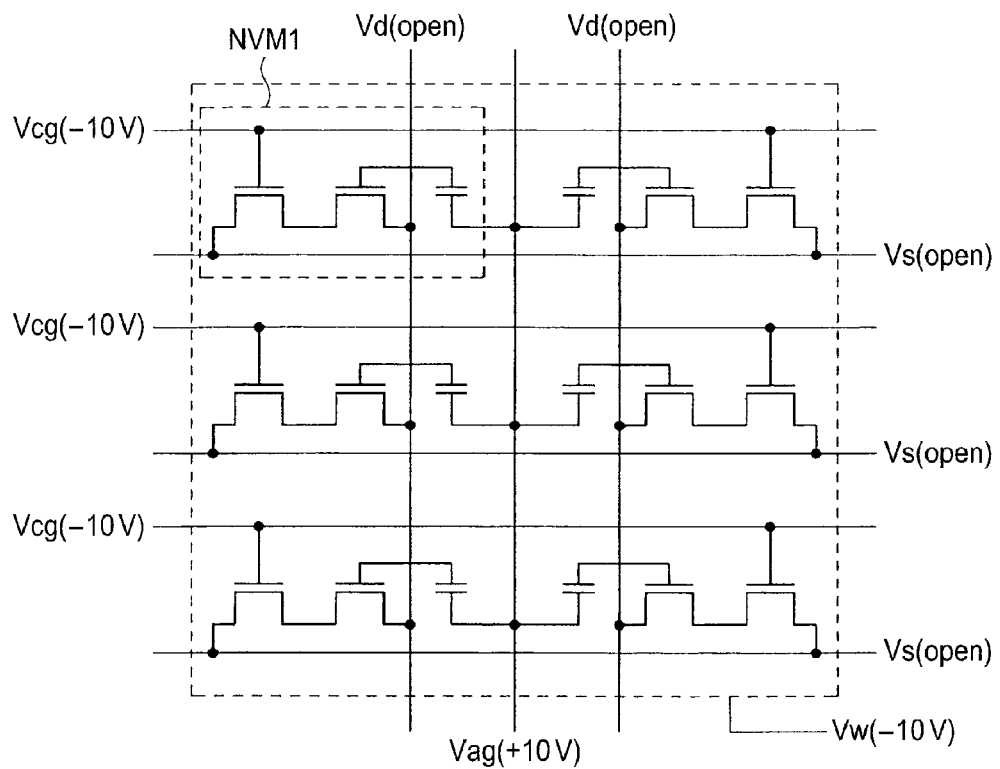
FIG. 12 is an equivalent circuit diagram illustrating the erase operation of nonvolatile memory cells in the first embodiment of the invention.
Figure 13:
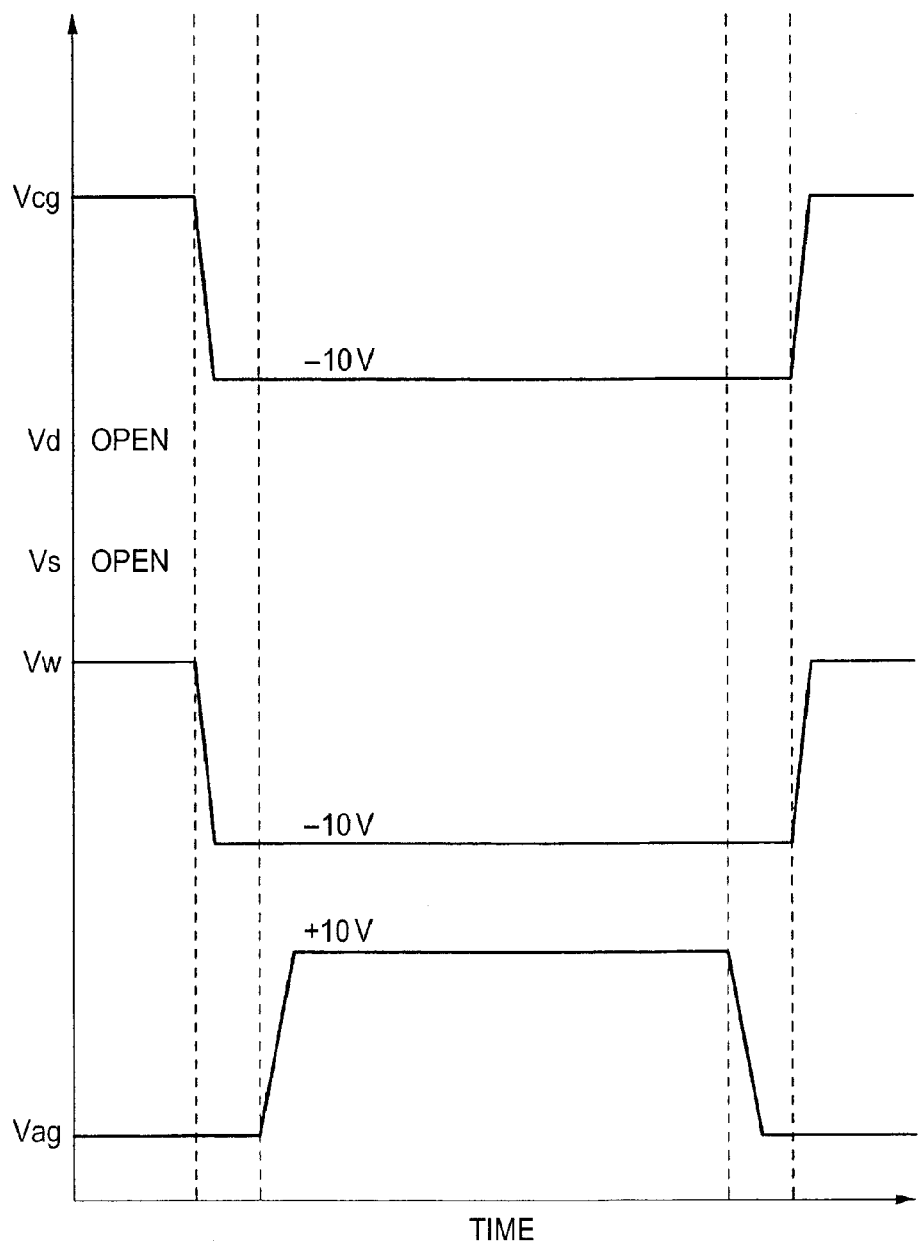
FIG. 13 is a graph chart indicating the timing of applied voltage during the erase operation of nonvolatile memory cells in the first embodiment of the invention.

Description will be given to the erase operation of each nonvolatile memory cell NVM1 in the first embodiment with reference to FIG. 11 to FIG. 13. FIG. 11 is an explanatory drawing schematically depicting the section in the nonvolatile memory cell NVM1 corresponding to FIG. 3. FIG. 12 is an equivalent circuit diagram of multiple nonvolatile memory cells NVM1 arranged in an array pattern. FIG. 13 is a timing chart of each of the voltages Vcg to Vag.

In erase operation, electrons e in the floating gate electrode FG are discharged to the second n-well NW2 by the FN (Fowler Nordheim) tunneling phenomenon. In the nonvolatile memory cell NVM1 in the first embodiment, for example, −10V is applied as the control gate voltage Vcg, −10V is applied as the well voltage Vw, and +10V is applied as the auxiliary gate voltage Vag in erase operation. The other nodes are brought into open state. The drain voltage Vd and the source voltage Vs may be matched with the control gate voltage Vcg or the well voltage Vw.

As the result of the adoption of the above voltage condition, −10V is applied to the first n-well NW1 under the floating gate electrode FG and +10V is applied to the second n-well NW2, or another place under the floating gate electrode FG. Therefore, the potential arising from the capacity coupling corresponding to the capacitance between the floating gate electrode FG and the first n-well NW1 and the capacitance between the floating gate electrode FG and the second n-well NW2 is applied to the floating gate electrode FG. More specific description will be given. The potential of the floating gate electrode FG is induced in the negative direction by the negative potential of the first n-well NW1 and is induced in the positive direction by the positive potential of the second n-well NW2. The induced potential is determined by the ratio of the capacitance of the applied portion to the total capacitance. When the capacity ratio on the first n-well NW1 side is high, the potential of the floating gate electrode FG is largely influenced by the potential on the first n-well NW1 side. As a result, a larger potential difference is produced between the floating gate electrode FG and the second n-well NW2. In each nonvolatile memory cell NVM1 in the first embodiment, the floating gate electrode FG and the second n-well NW2 are separated only by the thin floating gate insulating film 4 and an electric field is produced by the above potential difference. Therefore, electrons e in the floating gate electrode FG are subjected to the large positive electric field of the second n-well NW2 arising from the auxiliary gate voltage Vag and discharged to the second n-well NW2 by the FN tunneling phenomenon. Thus the electric charges of the floating gate electrode FG are removed and an erased state is achieved.

In the nonvolatile memory cell only having a floating gate electrode and an MIS transistor examined by the present inventors, the above erase operation could not be carried out and only the OTP operation could be performed. In the nonvolatile memory cell NVM1 in the first embodiment, meanwhile, electrons e in the floating gate electrode FG can be extracted and thus erase operation can be achieved by providing its structure with the second n-well NW2. As a result, it is possible to enhance the performance of a semiconductor device including the nonvolatile memory cells.

Hereafter, detailed description will be given to a structure suitable for the achievement of the above operations in each nonvolatile memory cell NVM1 in the first embodiment. FIG. 1 to FIG. 3 will be referred to unless otherwise stated especially.

In the nonvolatile memory cell NVM1 in the first embodiment, it is more desirable that the first n-well NW1 and the second n-well NW2 should be identical in depth from the semiconductor substrate to the bottom portion and n-type impurity concentration. This is because the adoption of this structure makes it possible to apply the same ion implantation process both to the first n-well NW1 and to the second n-well NW2. This simplifies the manufacturing process and makes it possible to achieve the enhancement of yield and reliability.

When the first n-well NW1 and the second n-well NW2 are formed by different processes, meanwhile, it is more desirable to adopt the following structure: a structure in which the n-type impurity concentration of the second n-well NW2 is higher than the n-type impurity concentration of the first n-well NW1. The reason for this is as follows: when the n-type impurity concentration of the second n-well NW2 is higher, the potential gradient becomes steep when voltage is applied to the second n-well NW2 and voltage loss is reduced in proximity to the floating gate insulating film 4. Therefore, voltage required for erase operation can be reduced. Further, erase operation can be accelerated for the same reason. As a result, it is possible to further enhance the performance of a semiconductor device including the nonvolatile memory cells.

Figure 14:
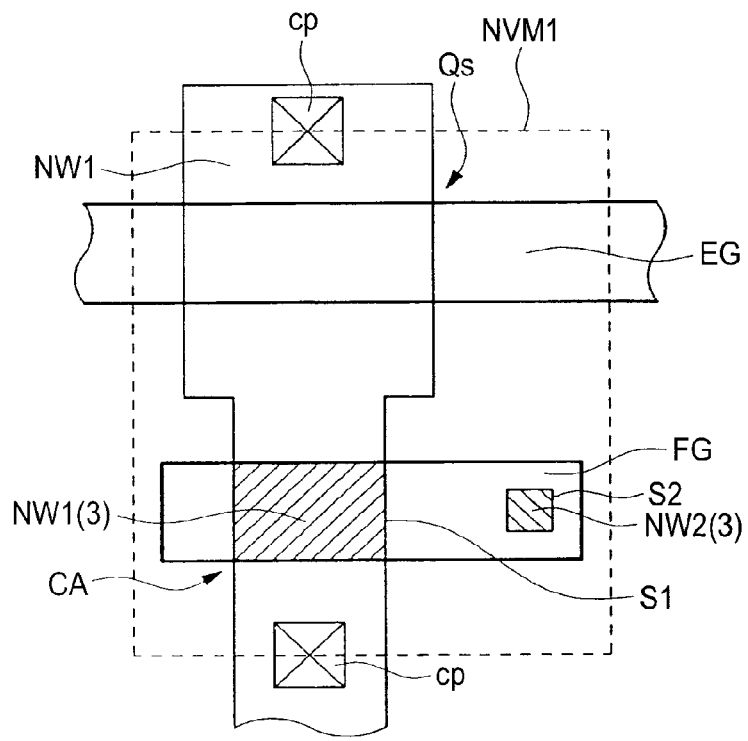
FIG. 14 is a substantial part plan view of a nonvolatile memory cell in the first embodiment of the invention.

FIG. 14 is a substantial part plan view equivalent to one nonvolatile memory cell NVM1 in the first embodiment. In each nonvolatile memory cell NVM1 in the first embodiment, it is more desirable that a second area S2 should be smaller than a first area S1. The first area S1 is the area of the portion of the first n-well NW1 planarly overlapping with the floating gate electrode FG and the second area S2 is the area of the portion of the second n-well NW2 planarly overlapping with the floating gate electrode FG. The reason for this will be described in detail below.

Figure 15:
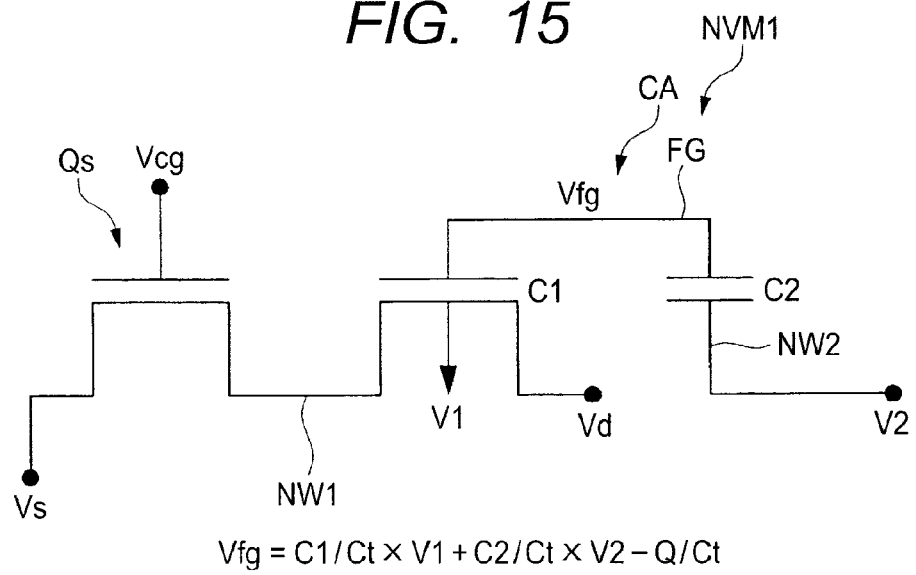
FIG. 15 is an equivalent circuit diagram explaining the operation of a nonvolatile memory cell in the first embodiment of the invention.

FIG. 15 illustrates an equivalent circuit of a nonvolatile memory cell NVM1 in the first embodiment. Here, the capacitance formed by the first n-well NW1 and the floating gate electrode FG in the electric charge storage portion CA will be designated as first capacitance C1 and the capacitance formed by the second n-well NW2 and the floating gate electrode FG will be designated as second capacitance C2. The sum of the first capacitance C1 and the second capacitance C2 will be designated as total capacitance Ct for the purpose of calculation. The voltage of the first n-well NW1 will be designated as first voltage V1 and the voltage of the second n-well NW2 will be designated as second voltage V2 for the sake of convenience. The electric charges accumulated in the floating gate electrode FG will be designated as accumulated charge amount Q.

At this time, the floating gate voltage Vfg, or the voltage of the floating gate electrode FG, is expressed as $C1/Ct \times V1 + C2/Ct \times V2 - Q/Ct$. That is, for efficient erasing, it is required to increase the potential difference between the floating gate voltage Vfg and the second voltage V2 to earn FN tunnel current. It is understood that C2/Ct only has to be reduced as much as possible for this purpose. Therefore, increasing the first capacitance C1 relative to the second capacitance C2 is effective. That is, it is effective to make the area where the first n-well NW1 and the floating gate electrode FG overlap with each other larger than the area where the second n-well NW2 and the floating gate electrode FG overlap with each other. As a result, it is possible to further enhance the performance of a semiconductor device including the nonvolatile memory cells.

Figure 16:
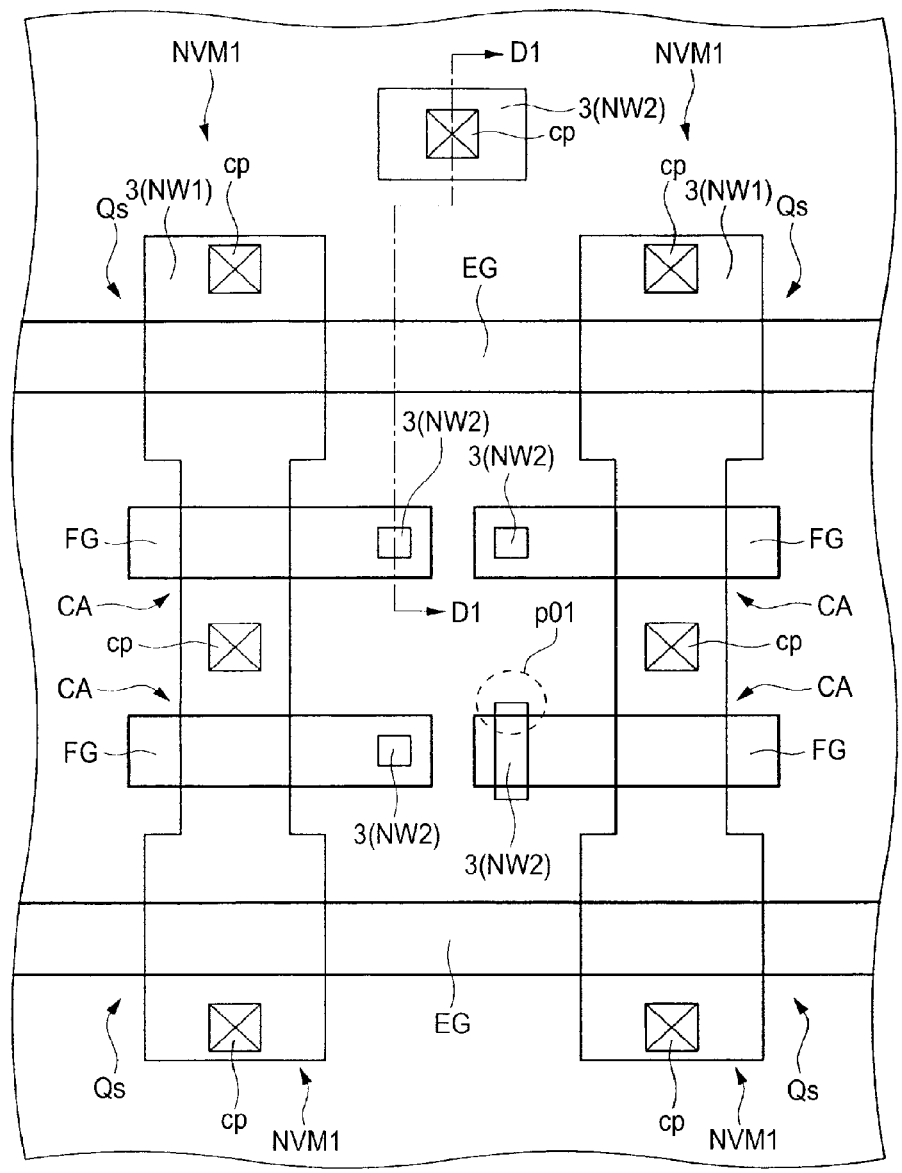
FIG. 16 is a substantial part plan view of nonvolatile memory cells in the first embodiment of the invention.
Figure 17:
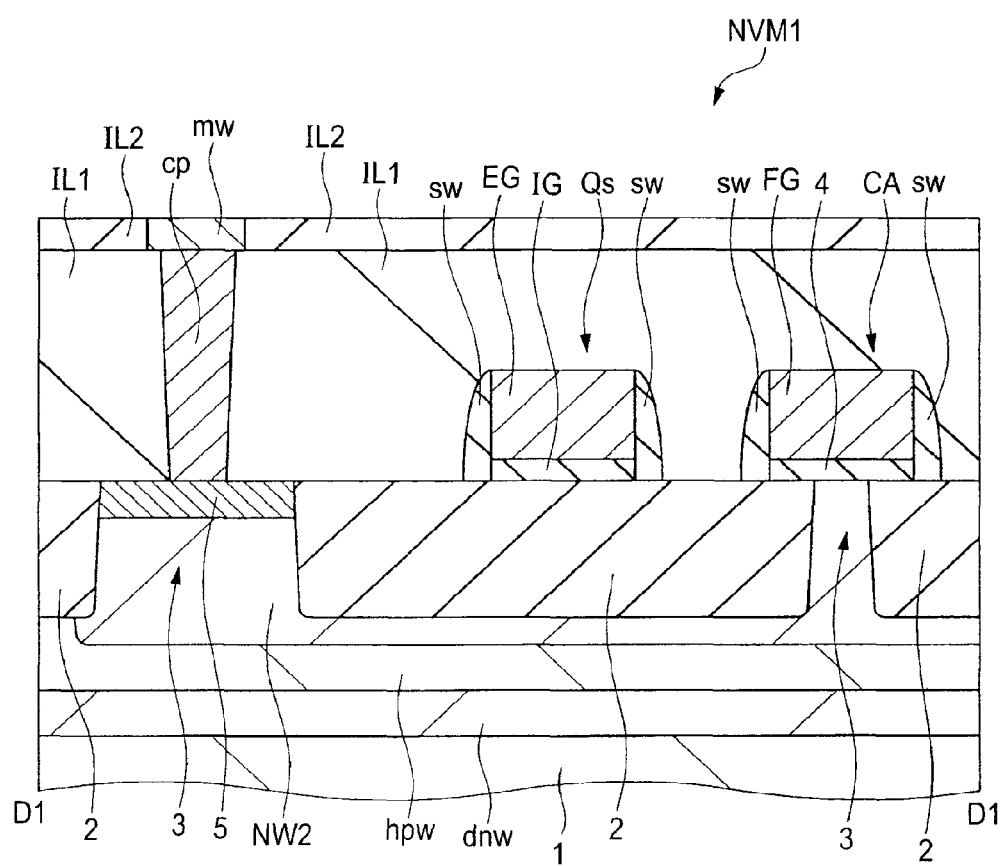
FIG. 17 is a substantial part sectional view of the semiconductor device in the first embodiment taken along line D1-D1 in the substantial part plan view in FIG. 16 and viewed in the direction of the arrows.

Detailed description will be given to a method for feeding power to the second n-well NW2 which is one of the characteristic respects in the structure of the first embodiment. FIG. 16 is a substantial part plan view of nonvolatile memory cells NVM1 in the first embodiment. FIG. 17 is a substantial part sectional view of the first embodiment taken along line D1-D1 of FIG. 16 and viewed in the direction of the arrows. As illustrated in the drawing, each nonvolatile memory cell NVM1 in the first embodiment is so structured that the second n-well NW2 is passed under the isolation portion 2 and routed to a place with an adequate planar margin and a contact plug cp is formed there. The adoption of this structure makes it possible to independently feed power to the second n-well NW2.

An n-type high-concentration layer 5 may be formed in the area where a contact plug cp and the second n-well NW2 are coupled together for the reduction of contact resistance.

As shown in the principal part p01 in FIG. 16, the active region 3 for the formation of the capacity coupling between the second n-well NW2 and the floating gate electrode FG may be in the following shape: a shape in which it is protruded from the floating gate electrode FG as viewed in a plane.

Figure 18:
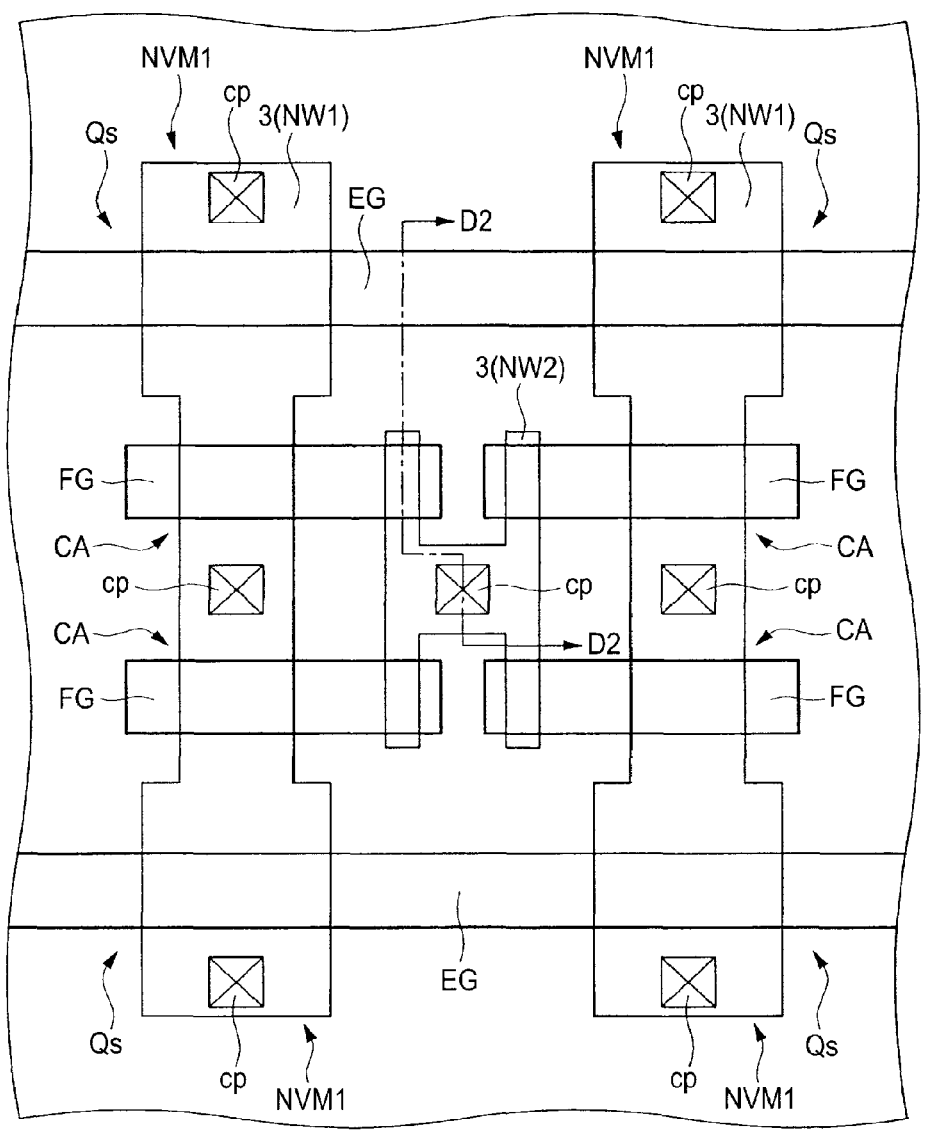
FIG. 18 is a substantial part plan view of other nonvolatile memory cells in the first embodiment of the invention.
Figure 19:
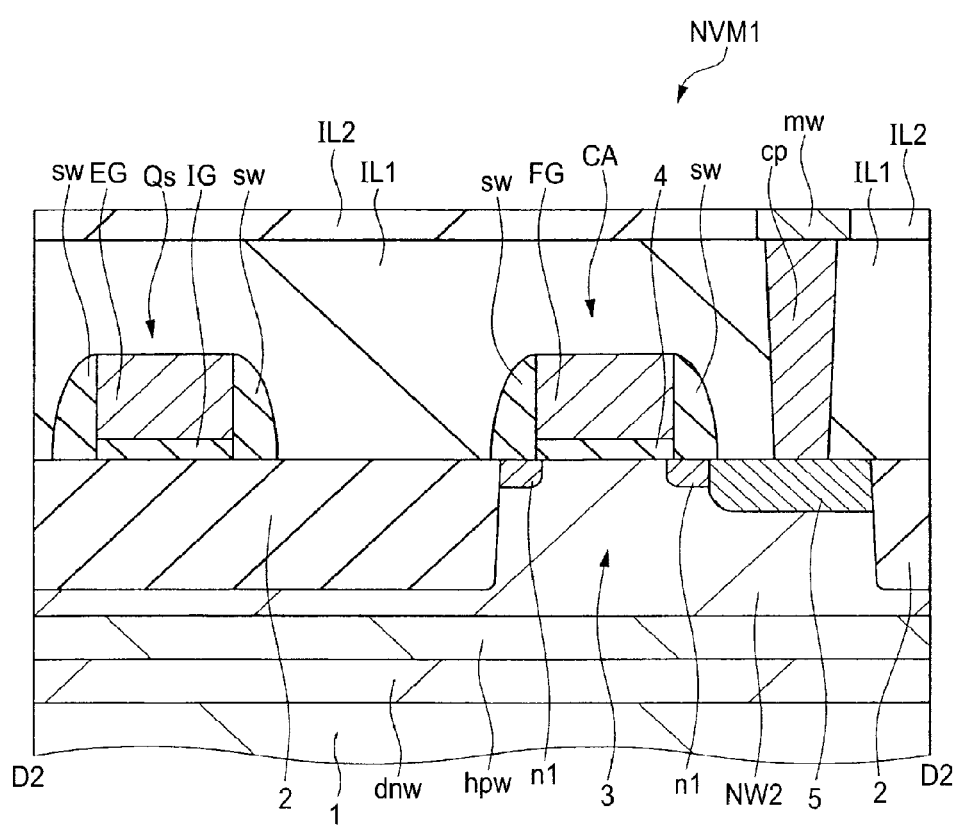
FIG. 19 is a substantial part sectional view of the semiconductor device in the first embodiment taken along line D2-D2 in the substantial part plan view in FIG. 18 and viewed in the direction of the arrows.

Description will be given to another structure for feeding power to the second n-well NW2 with reference to FIG. 18 and FIG. 19. FIG. 18 is a substantial part plan view of nonvolatile memory cells NVM1 in the first embodiment. FIG. 19 is a substantial part sectional view of the first embodiment taken along line D2-D2 of FIG. 18 and viewed in the direction of the arrows. In this structure, the active region 3 for the formation of the capacity coupling by the second n-well NW2 and the floating gate electrode FG is extended to outside the floating gate electrode FG and a contact plug cp is formed there. Especially, FIG. 18 illustrates an example in which structures for feeding power to the second n-well NW2 equivalent to four cells are put together. Aside from this, a contact plug cp may be independently provided in each nonvolatile memory cell NVM1 or a contact plug may be provided in the diffusion layers on both sides for feeding power. In the second n-well NW2, there are formed an n-type extension region n1 as a semiconductor region of n conductivity type and the n-type high-concentration layer 5. The n-type high-concentration layer 5 is deeper than the n-type extension region n1 in depth from the main surface of the silicon substrate 1 and higher than the n-type extension region n1 in n-type impurity concentration. The n-type extension region n1 and the n-type high-concentration layer 5 can also be formed by the same process as for the extension region and source-drain region (high-concentration diffusion layer) of an n-type MISFET formed in the peripheral circuit region of the nonvolatile memory cell NVM1.

The nonvolatile memory cell NVM1 in the first embodiment shows different aspects depending on whether or not the bottom portion of the second n-well NW2 is in contact with the n-well dnw for isolation. This will be described in detail below.

Figure 20:
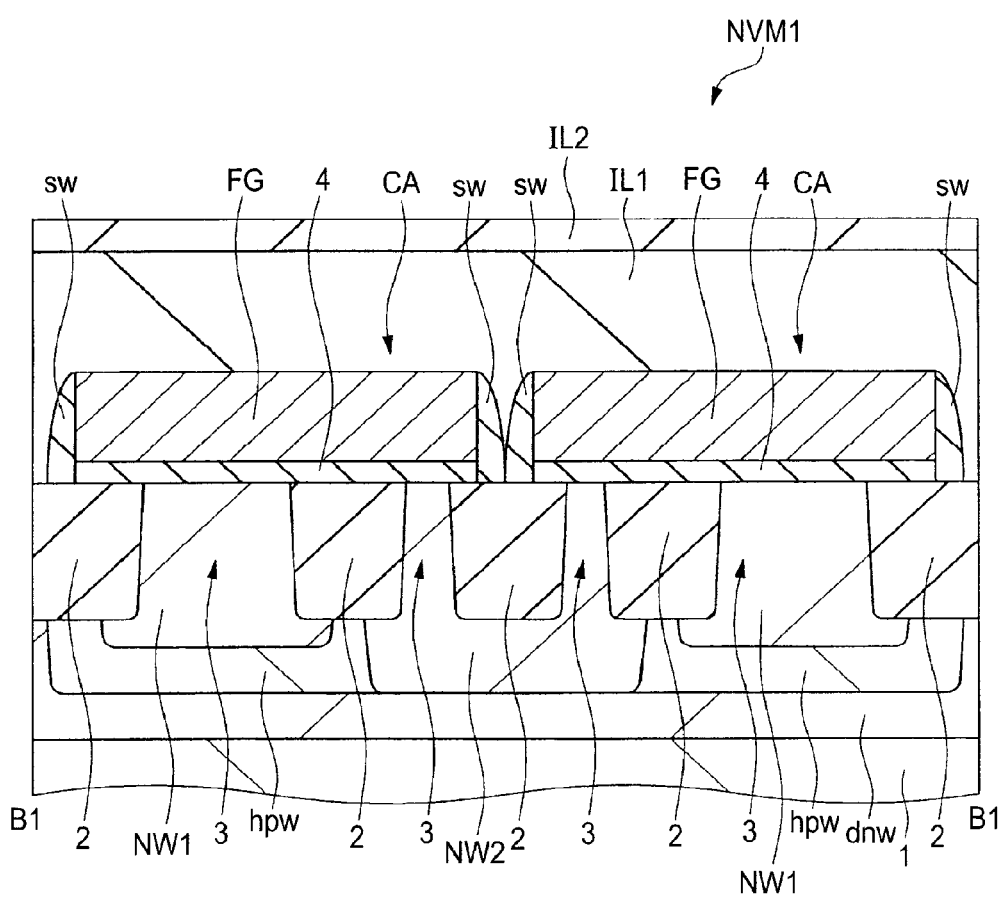
FIG. 20 is a substantial part sectional view of further another nonvolatile memory cell in the first embodiment of the invention, taken along line B1-B1 in the substantial part plan view in FIG. 1 and viewed in the direction of the arrows.

FIG. 20 is a substantial part sectional view of the place corresponding to FIG. 3 in another structure of the nonvolatile memory cell NVM1 in the first embodiment. In this structure, the bottom portion of the second n-well NW2 is in contact with the n-well dnw for isolation. The n-well dnw for isolation and the second n-well NW2 are of the same conductivity type, or n conductivity type; therefore, it turns out that the second n-well NW2 and the n-well dnw for isolation are electrically coupled to each other. As mentioned above, the n-well dnw for isolation is integrally formed so that it embraces multiple nonvolatile memory cells NVM1. Therefore, the adoption of this structure makes it possible to handle the second n-wells NW2 of multiple nonvolatile memory cells NVM1 as of the same potential in a lump. This is suitable for cases where, for example, mat erasing is applied and erase operation is carried out on multiple nonvolatile memory cells NVM1 in a lump or for other like cases. The scale of erasable blocks is determined according to how many nonvolatile memory cells NVM1 are embraced in the n-well dnw for isolation. According to mat erasing, it is possible to reduce the number of feeding portions to the second n-well NW2 with respect to each erasing block and thus to obtain a structure in which the cell area can be easily reduced.

Figure 21:
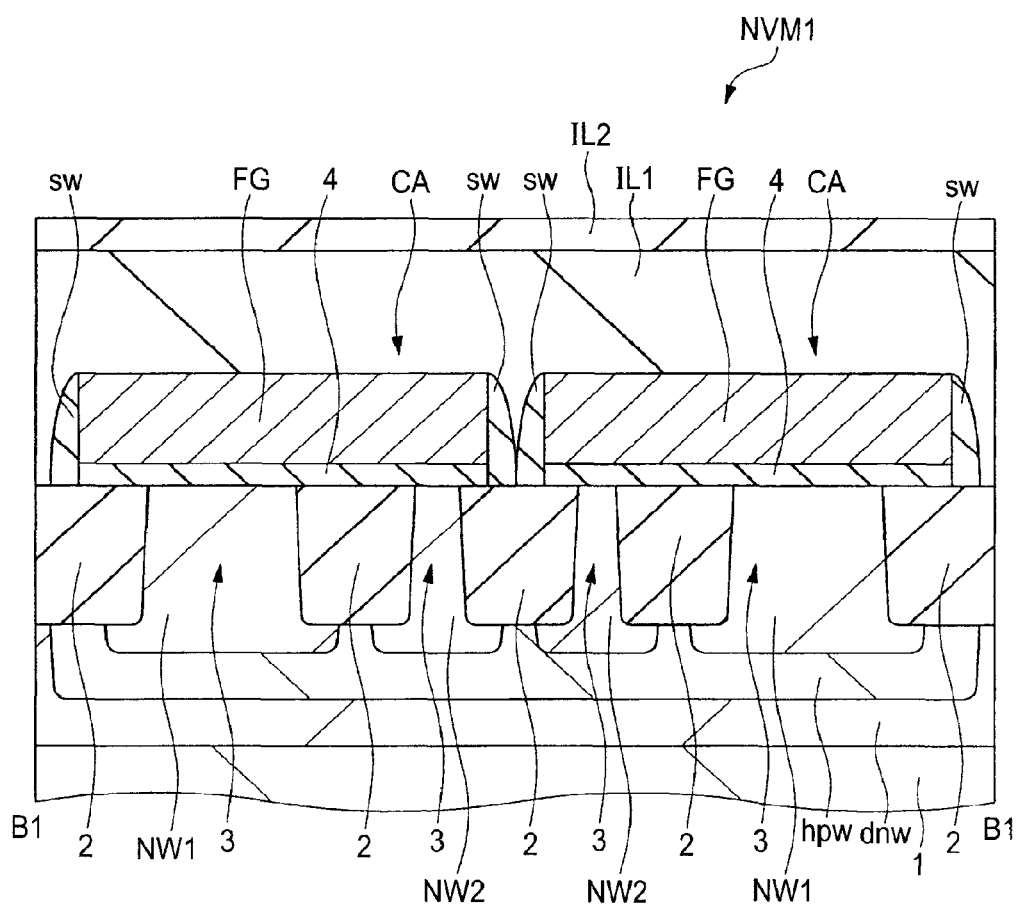
FIG. 21 is a substantial part sectional view of further another nonvolatile memory cell in the first embodiment of the invention, taken along line B1-B1 in the substantial part plan view in FIG. 1 and viewed in the direction of the arrows.

FIG. 21 is a substantial part sectional view of the place corresponding to FIG. 3 in further another structure of the nonvolatile memory cell NVM1 in the first embodiment. In this structure, the bottom portion of the second n-well NW2 is not in contact with the n-well dnw for isolation. That is, the second n-well NW2 and the n-well dnw for isolation are electrically isolated from each other by the p-well hpw for element. This makes it possible to individually carry out erase operation with respect to each of the nonvolatile memory cells NVM1. Especially, FIG. 21 illustrates a structure in which the n-well dnw for isolation and the second n-well NW2 are not in contact with each other and the second n-well NW2 is not shared between the relevant nonvolatile memory cell and adjacent nonvolatile memory cells NVM1. The adoption of this structure makes it possible to feed power to the second n-well NW2 with respect to each single nonvolatile memory cell NVM1, that is, to carry out erase operation on a bit-by-bit basis. As a result, it is possible to configure a memory circuit in which more complicated erase operation can be carried out.

In the nonvolatile memory cell NVM1 in the first embodiment, as mentioned above, erase operation can be carried out in a single gate-layer nonvolatile memory cell by providing the second n-well NW2. As a result, it is possible to further enhance the performance of a semiconductor device including the nonvolatile memory cells.

(Second Embodiment)

With respect to the nonvolatile memory cell NVM1 in the first embodiment, it has been described that the erase operation of a single gate-layer nonvolatile memory cell is made possible by providing the second n-well NW2. With respect to the second embodiment, description will be given to a technology that makes it possible to further enhance the efficiency of write operation with the same structure as that of the nonvolatile memory cell NVM1. Since the structure of each nonvolatile memory cell itself is the same as in the first embodiment and repetitive description thereof will be omitted here.

Figure 22:
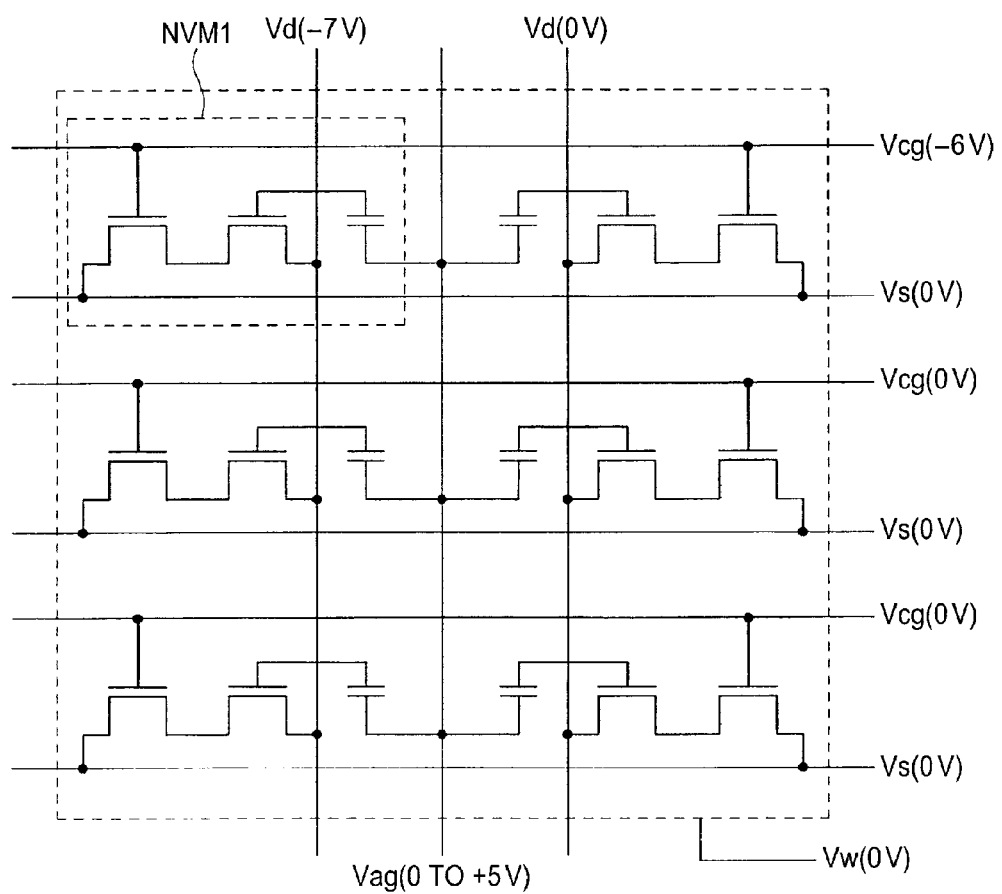
FIG. 22 is an equivalent circuit diagram illustrating the write operation of nonvolatile memory cells in a second embodiment of the invention.
Figure 23:
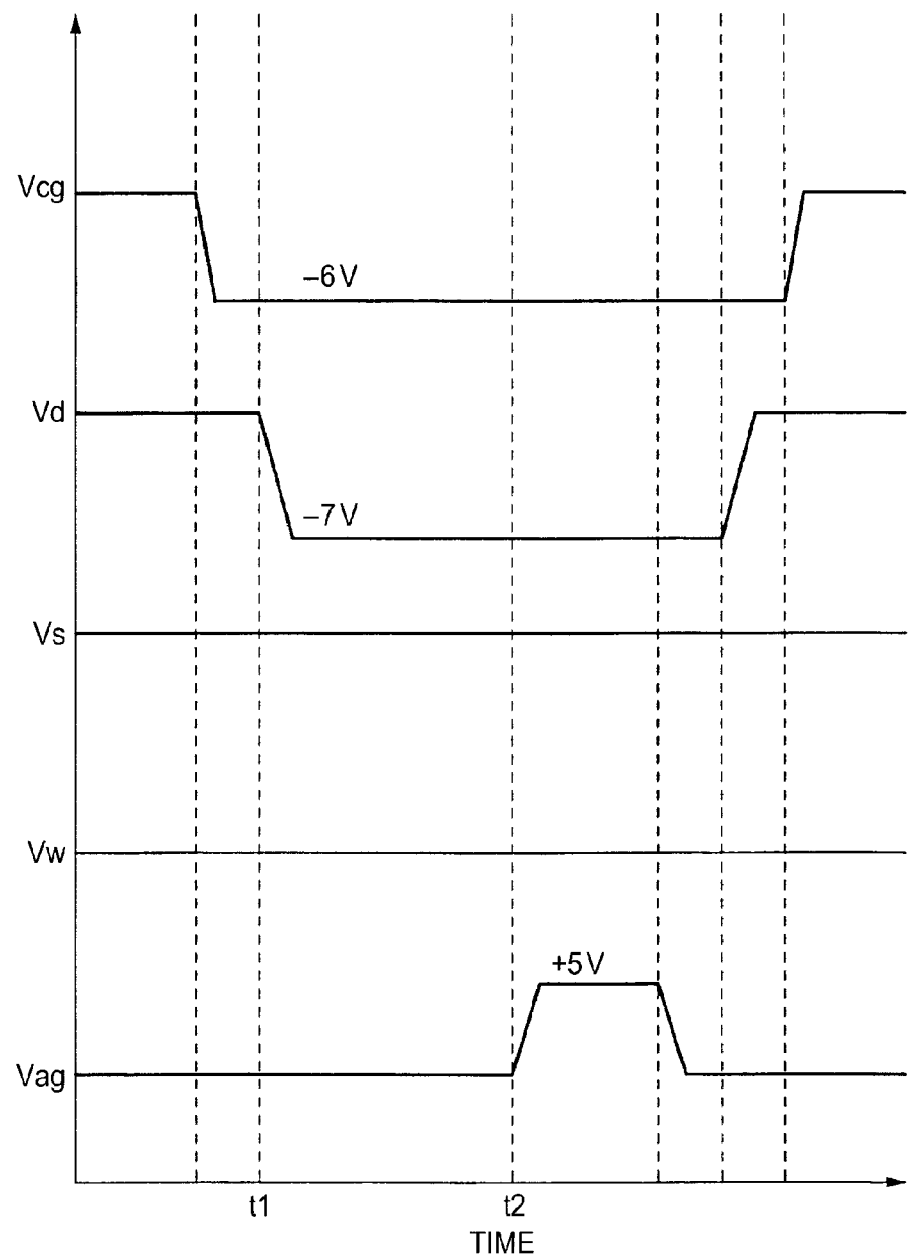
FIG. 23 is a graph chart indicating the timing of applied voltage during the write operation of nonvolatile memory cells in the second embodiment of the invention.

In the nonvolatile memory cell in the second embodiment, the voltage condition in write operation is different from that in the first embodiment as described later with reference to FIG. 22 and FIG. 23. FIG. 22 is an equivalent circuit diagram of multiple nonvolatile memory cells NVM1 arranged in an array pattern. FIG. 23 is a timing chart of each of the voltages Vcg to Vag in write operation in the second embodiment.

With respect to the write operation of each nonvolatile memory cell in the first embodiment, description has been given with reference to FIG. 5 to FIG. 8. In that description, 0V is applied as the auxiliary gate voltage Vag. In the write operation of each nonvolatile memory cell in the second embodiment, meanwhile, voltage of up to 5V or so is applied also as the auxiliary gate voltage Vag in the write operation of the nonvolatile memory in the first embodiment. However, its timing is different as described below. In the first embodiment, −7V is applied as the drain voltage Vd at first time (first stage) t1 and thereafter +5V is applied as the auxiliary gate voltage Vag at second time (second stage) t2. That is, negative voltage is applied to the storage portion p-well PW at the first stage and thereafter positive voltage is applied to the second n-well NW2 at the second stage. The effect of voltage being applied in two stages and positive voltage being applied to the second n-well NW2 as mentioned above will be described in detail below.

As described with reference to FIG. 8, the following takes place in write operation utilizing the injection of electrons into the floating gate electrode FG by the DAHE injection: electrons are injected most efficiently when the floating gate electrode FG is at −1V or so. To establish this voltage condition utilizing a capacity coupling, −7V is applied to the storage portion p-well PW. However, the floating gate electrode FG is gradually negatively charged by its own electric field as electrons are further accumulated in the floating gate electrode FG during write operation. This means that shift to the negative high voltage side occurs in the characteristic curve in FIG. 8. That is, the efficiency of injection of electrons into the floating gate electrode FG is gradually reduced.

In the write operation of each nonvolatile memory cell in the second embodiment, meanwhile, the following can be implemented by applying positive voltage to the second n-well NW2: the floating gate electrode FG can be positively charged by the capacity coupling between the second n-well NW2 and the floating gate electrode FG. Further, this application of positive voltage to the second n-well NW2 is carried out when a desired time has passed after write operation was started. Therefore, it is possible to restore the floating gate electrode FG negatively charged during write operation and set it to a voltage band in which electrons are efficiently injected. This makes it possible to sufficiently carry out write operation in a shorter time. As a result, it is possible to further enhance the performance of a semiconductor device including the nonvolatile memory cells.

The above effect is obtained by providing the floating gate electrode FG in the nonvolatile memory cell NVM1 in the present application with the second n-well NW2 that can form an independent capacity coupling separate from the storage portion p-well PW.

Figure 24:
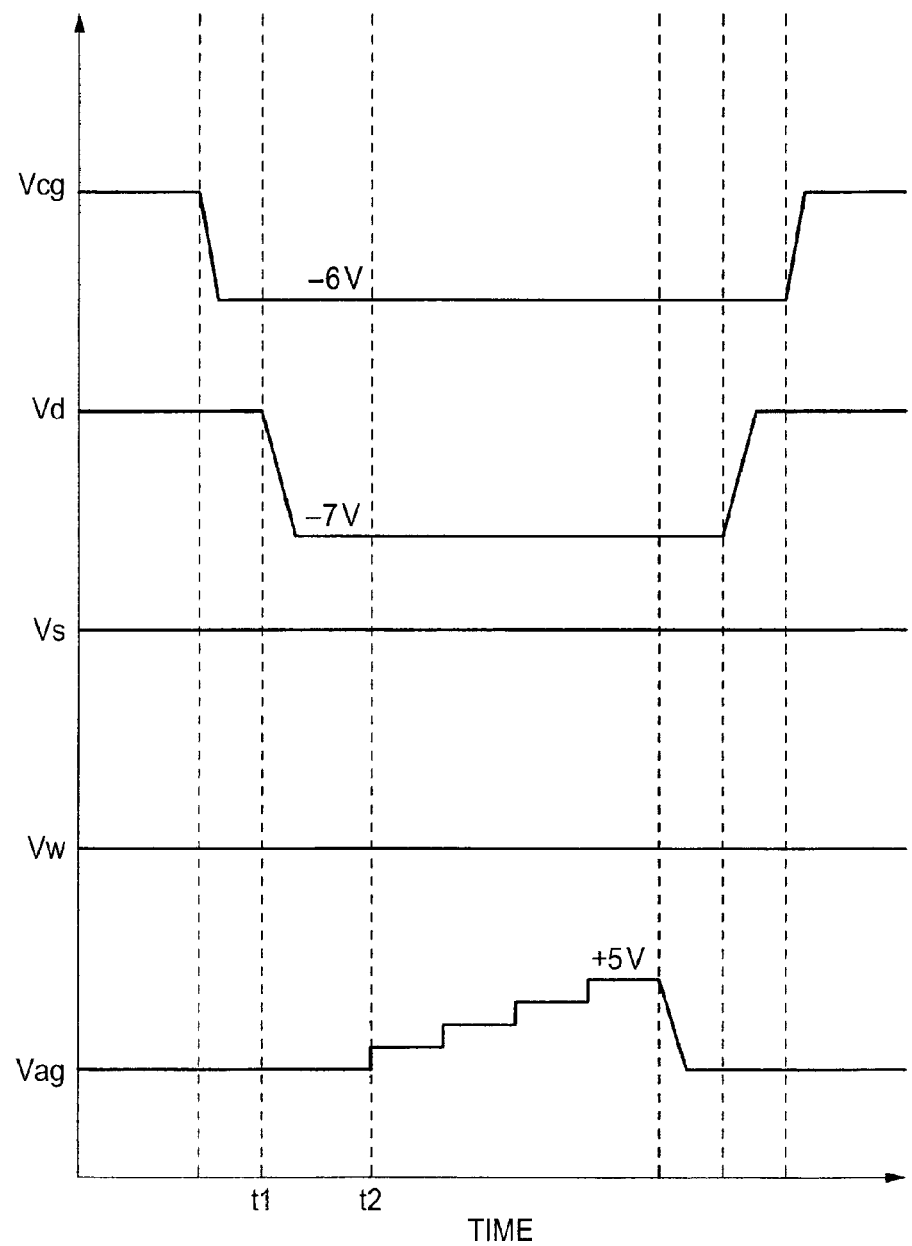
FIG. 24 is a graph chart indicating the timing of applied voltage during another write operation of nonvolatile memory cells in the second embodiment of the invention.
Figure 25:
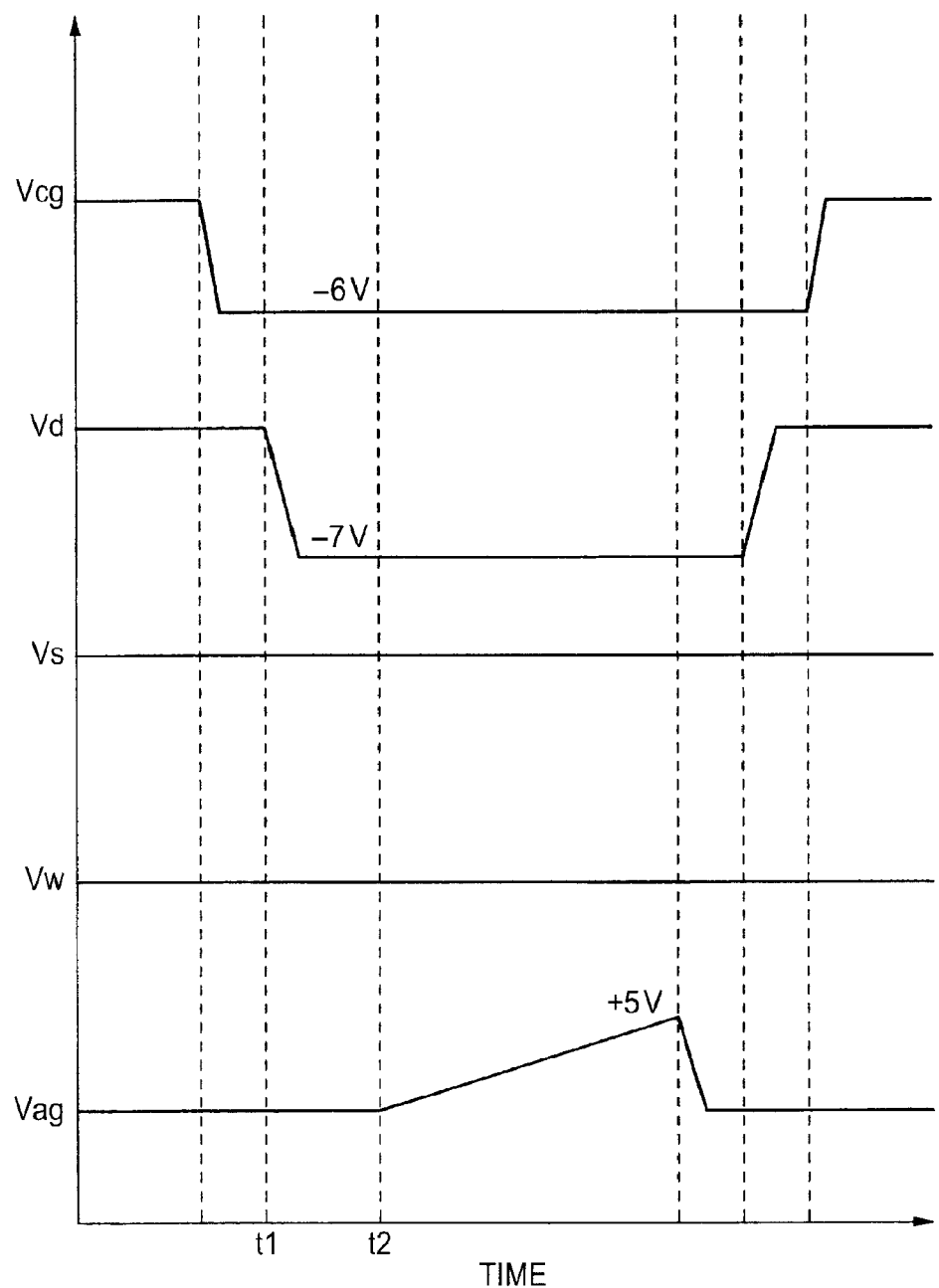
FIG. 25 is a graph chart indicating the timing of applied voltage during further another write operation of nonvolatile memory cells in the second embodiment of the invention.

The method for applying positive voltage as the auxiliary gate voltage Vag is not limited to the foregoing. For example, it may be gradually applied stepwise as indicated in FIG. 24 or may be continuously gradually applied as indicated in FIG. 25.

Up to this point, concrete description has been given to the invention made by the present inventors based on embodiments. However, the invention is not limited to the above embodiments and can be variously modified without departing from the subject matter thereof, needless to add.

The invention can be applied to a semiconductor device including nonvolatile memory cells.

What is claimed is:

1. A semiconductor device comprising nonvolatile memory cells arranged over a semiconductor substrate,
wherein each of the nonvolatile memory cells comprises:
a first semiconductor region of a first conductivity type formed in the semiconductor substrate and extending along a first direction in plan view;
a first gate electrode of a selection transistor formed over the first semiconductor region;
a floating gate electrode formed over the first semiconductor region;

a third semiconductor region of a second conductivity type opposite to the first conductivity type formed in the first semiconductor region and arranged at one side of the first gate electrode;
a fourth semiconductor region of the second conductivity type formed in the first semiconductor region and arranged between another side of the first gate electrode and one side of the floating gate electrode; and
a fifth semiconductor region of the second conductivity type formed in the first semiconductor region and arranged at another side of the floating gate electrode,
wherein a second semiconductor region of the first conductivity type is formed in the semiconductor substrate and electrically isolated from the first semiconductor region,
wherein the floating gate extends along a second direction perpendicular to the first direction in plan view and is formed over the second semiconductor region so as to overlap at least a portion of the second semiconductor region in plan view, and
wherein a STI structure, which includes an insulating film embedded in a groove formed in the semiconductor substrate, is arranged between the first and second semiconductor regions.

2. A semiconductor device according to the claim 1,
wherein a plan area of the second semiconductor region is smaller than a plan area of the first semiconductor region.

3. A semiconductor device according to the claim 2,
wherein the floating gate electrode entirely overlaps the second semiconductor region in plan view.

4. A semiconductor device according to the claim 2,
wherein a part of the second semiconductor region is protruded from the floating gate electrode in plan view.

5. A semiconductor device according to the claim 1,
wherein a first well region of the first conductivity type is formed in the semiconductor substrate,
wherein a second well region of the second conductivity type is formed in the first well region, and
wherein the first and second semiconductor regions are formed in the second well region and electrically isolated from each other by the second well region.

6. A semiconductor device according to the claim 1,
wherein, at an erase operation of the each nonvolatile memory cells, electrons accumulated in the floating gate electrode are discharged to the second semiconductor region.

7. A semiconductor device according to the claim 6,
wherein the erase operation utilizes Fowler Nordheim tunneling.

8. A semiconductor device according to the claim 1,
wherein the first conductivity type is n-type, and
wherein the second conductivity type is p-type.

9. A semiconductor device according to the claim 1,
wherein a first plug is connected to the third semiconductor region,
wherein a second plug is connected to the fifth semiconductor region, and
wherein no plugs are connected to the fourth semiconductor region.

10. A semiconductor device comprising nonvolatile memory cells arranged over a semiconductor substrate,
wherein each of the nonvolatile memory cells comprises:
an n-type first semiconductor region formed in the semiconductor substrate and extending along a first direction in plan view;
a first gate electrode of a selection transistor formed over the first semiconductor region;
a floating gate electrode formed over the first semiconductor region;
a p-type third semiconductor region formed in the first semiconductor region and arranged at one side of the first gate electrode;
a p-type fourth semiconductor region formed in the first semiconductor region and arranged between another side of the first gate electrode and one side of the floating gate electrode; and
a p-type fifth semiconductor region formed in the first semiconductor region and arranged at another side of the floating gate electrode,
wherein an n-type second semiconductor region is formed in the semiconductor substrate and electrically isolated from the first semiconductor region,
wherein the floating gate extends along a second direction perpendicular to the first direction in plan view and is formed over the second semiconductor region so as to overlap at least a portion of the second semiconductor region in plan view,
wherein, at an erase operation of the each nonvolatile memory cells, electrons accumulated in the floating gate electrode are discharged to the second semiconductor region by Fowler Nordheim tunneling,
wherein a first plug is connected to the third semiconductor region,
wherein a second plug is connected to the fifth semiconductor region, and
wherein no plugs are connected to the fourth semiconductor region.

11. A semiconductor device according to the claim 10,
wherein a plan area of the second semiconductor region is smaller than a plan area of the first semiconductor region.

12. A semiconductor device according to the claim 11,
wherein the floating gate electrode entirely overlaps the second semiconductor region in plan view.

13. A semiconductor device according to the claim 11,
wherein a part of the second semiconductor region is protruded from the floating gate electrode in plan view.

14. A semiconductor device according to the claim 10,
wherein a STI structure, which includes an insulating film embedded in a groove formed in the semiconductor substrate, is arranged between the first and second semiconductor regions.

15. A semiconductor device according to the claim 14,
wherein an n-type first well region is formed in the semiconductor substrate,
wherein a p-type second well region is formed in the first well region, and
wherein the first and second semiconductor regions are formed in the second well region and electrically isolated from each other by the second well region.

* * * * *